(12) United States Patent
de Figueiredo

(10) Patent No.: US 8,797,196 B2
(45) Date of Patent: Aug. 5, 2014

(54) PIPELINE ANALOG-TO-DIGITAL CONVERTER STAGES WITH IMPROVED TRANSFER FUNCTION

(71) Applicant: Synopsys, Inc., Mountain View, CA (US)

(72) Inventor: Pedro Miguel Ferreira de Figueiredo, São Domingos de Rana (PT)

(73) Assignee: Synopsys, Inc., Mountain View, CA (US)

(*) Notice: Subject to any disclaimer, the term of this patent is extended or adjusted under 35 U.S.C. 154(b) by 0 days.

(21) Appl. No.: 13/748,430

(22) Filed: Jan. 23, 2013

(65) Prior Publication Data
US 2013/0187802 A1    Jul. 25, 2013

Related U.S. Application Data

(60) Provisional application No. 61/590,258, filed on Jan. 24, 2012.

(51) Int. Cl.
*H03M 1/06* (2006.01)

(52) U.S. Cl.
USPC ............................................ 341/118; 341/161

(58) Field of Classification Search
USPC ................... 341/155, 118, 120, 161
See application file for complete search history.

(56) References Cited

U.S. PATENT DOCUMENTS

| | | | | |
|---|---|---|---|---|
| 6,894,631 B1* | 5/2005 | Bardsley | | 341/120 |
| 6,970,120 B1 | 11/2005 | Bjornsen | | |
| 7,129,874 B2* | 10/2006 | Bjornsen | | 341/143 |
| 7,830,287 B1* | 11/2010 | Huang | | 341/131 |
| 8,497,790 B1* | 7/2013 | Lewis et al. | | 341/120 |

OTHER PUBLICATIONS

Figueiredo, P. , "Addressing Power and Speed Requirements of Mobile Devices with Data Converter IP," Synopsys White Paper, Oct. 2011, 8 pages, Can Be Retrieved at URL:<https://www.synopsys.com/dw/doc.php/wp/dw_dcs_pipeline_gen3_adc_wp.pdf>.
Hernes, B. et. al., "A 92.5mW 205MS/s 10b pipeline IfADC implemented in 1.2V/3.3V 0.13μm CMOS," ISSCC Dig. Tech. Papers, pp. 462-463, Feb. 2007, pp. 462-463, 615.

* cited by examiner

*Primary Examiner* — Brian Young
(74) *Attorney, Agent, or Firm* — Fenwick & West LLP

(57) ABSTRACT

A connection scheme is used to selectively connect a dither capacitor included in a calibrated stage of a pipeline analog-to-digital converter (ADC) in a way that reduces the output voltage swing of the stage. A first terminal of the dither capacitor is coupled to an input of the amplifier. A second terminal of the dither capacitor is coupled to either a first or second reference voltage dependent on a bit value in a Pseudo-Random Binary Sequence (PRBS) if a voltage received by the stage is within a first voltage range. If the stage received voltage is within a second range, the second terminal is coupled to the first reference voltage independent of the PRBS. If the stage received voltage is within a third range, the second terminal is coupled to the second reference voltage independent of the PRBS.

19 Claims, 15 Drawing Sheets

PIPELINE ANALOG-TO-DIGITAL CONVERTER STAGES WITH IMPROVED TRANSFER FUNCTION

CROSS-REFERENCE TO RELATED APPLICATION

This application claims the benefit of U.S. Provisional Application 61/590,258, filed Jan. 24, 2012, which is incorporated by reference herein in its entirety. This application is also related to U.S. application Ser. No. 13/742,212, filed Jan. 15, 2013.

BACKGROUND

1. Field of Art

The disclosure generally relates to the field of analog-to-digital converters (ADCs), and more specifically to calibrating pipeline ADCs.

2. Description of the Related Art

An analog-to-digital converter (ADC) is an electronic device that converts an analog signal (e.g., voltage signal) into a series of discrete digital values. The digital values are proportional to the magnitude of the analog signal. One type of ADC is a pipeline ADC which includes multiple stages in series. The first stage performs a quantization and outputs the resulting bits. Additionally, the first stage amplifies a residue voltage, which is the error that remains after the first stage performs the quantization. The amplified residue is output to the second stage of the pipeline ADC for further quantization. The second stage also outputs bits and generates another residue voltage that is fed to the third stage for quantization. The process continues until all the bits of the ADC have been resolved.

In order for a stage in the pipeline ADC to generate the appropriate residue voltage, the stage needs an amplifier with a certain gain. Any deviation from that gain value causes non-linearities in the transfer function of the ADC. In typical switched-capacitor implementations of a stage, deviation from the ideal gain value is caused by capacitor mismatches and finite low frequency gain of the amplifier (usually referred to as the "DC gain"). To achieve high resolution with low power dissipation, digital calibration may be used to correct the deviations. To accurately correct the deviations, it is necessary to determine calibration coefficients for the stages.

SUMMARY

Embodiments relate to a connection scheme used in selectively connecting a dither capacitor included in a calibrated stage of a pipeline analog-to-digital converter (ADC) in a way that reduces the output voltage swing of the stage but still allows the injection of a sequence of binary values in order to determine a calibration coefficient to account for a gain error of the stage. Each calibrated stage of the pipeline ADC includes an amplifier for amplifying a residue voltage of the stage and a dither capacitor. A first terminal of the dither capacitor is coupled to an input of the amplifier and a second terminal is selectively coupled based on a voltage received by the stage in an operational mode.

In one embodiment, if the received voltage is less than one fourth of a negative reference voltage, the second terminal is coupled to a positive reference voltage. If the received voltage is greater than one fourth of the positive reference voltage, the second terminal is coupled to the negative reference voltage.

In one embodiment, if the received voltage is between one fourth of the negative reference voltage and one fourth of the positive reference voltage, a sequence of the binary values is injected through the second terminal of the dither capacitor. The sequence is injected by coupling the second terminal to the positive reference voltage or the negative reference voltage based on a bit value of the sequence of the binary values.

BRIEF DESCRIPTION OF DRAWINGS

The disclosed embodiments have other advantages and features which will be more readily apparent from the detailed description, the appended claims, and the accompanying figures (or drawings). A brief introduction of the figures is below.

DETAILED DESCRIPTION

Figure 1:
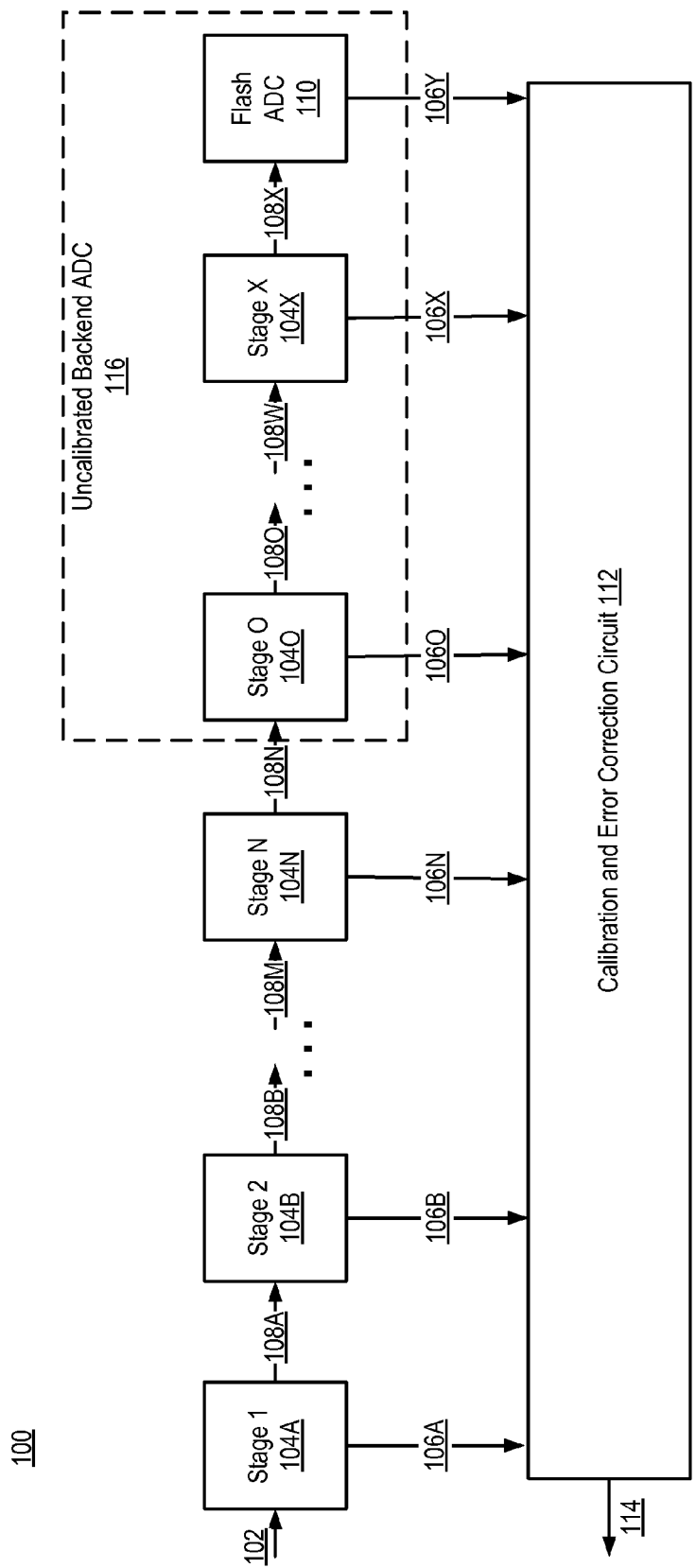
FIG. 1 is a block diagram of a pipeline ADC, according to one embodiment.

The Figures (FIGS.) and the following description relate to preferred embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. The figures depict embodiments of the disclosed system (or method) for purposes of illustration only. It should be recognized from the following description that alternative embodiments of the structures and methods illustrated herein may be employed without departing from the principles described herein.

The figures use like reference numerals to identify like elements. A letter after a reference numeral, such as "104A," indicates that the text refers specifically to the element having that particular reference numeral. A reference numeral in the text without a following letter, such as "104," refers to any or all of the elements in the figures bearing that reference numeral.

Embodiments relate to calibrated stages of a pipeline ADC where a connection scheme is used to selectively connect a dither capacitor included in a calibrated stage in a way that reduces the output voltage swing of the stage but still allows the injection of a Pseudo-Random Binary Sequence (PRBS). The PRBS is injected in order to determine a calibration coefficient to account for a gain error of the stage. Each calibrated stage includes a multiplying digital-to-analog converter (MDAC) with an amplifier and a dither capacitor. A first terminal of the dither capacitor is connected to an input of the amplifier and a second terminal is selectively coupled based on a voltage received by the stage in an operation mode.

If the received voltage is within a first range, the second terminal is coupled to a positive reference voltage. If the received voltage is within a second range, the second terminal is coupled to a negative reference voltage. Further, if the received voltage is within a third range, the second terminal is coupled to either the positive reference voltage or the negative reference voltage dependent on a bit value in a PRBS.

A pipeline analog-to-digital converter (ADC) herein refers to an analog-to-digital converter that includes multiple cascaded stages connected in series. Each of the stages receives an input voltage or a residue voltage from a previous stage at its input terminal and generates a number of bits representing digital values of the input voltage or the residue voltage at a corresponding resolution.

A gain error herein refers to a ratio between a value that is output by a non-ideal multiplying digital-to-analog converter (MDAC) and a value that would be output by an ideal MDAC.

An operational mode herein refers to a mode of a pipeline ADC in which the pipeline ADC uses its stages to digitize an input voltage into a number of bits. An operational mode may include, among other phases, a sampling phase and an amplification phase.

A calibration mode herein refers to a mode of a pipeline ADC in which the pipeline ADC is not available to digitize an input voltage into a number of bits.

A Pseudo-Random Binary Sequence (PRBS) refers to a random sequence of binary bit values. The values of a bit in the sequence may include values of 1 or −1.

Overview of Pipeline Analog-to-Digital Converter

Figure (FIG. 1 is a block diagram illustrating a pipeline ADC 100, according to one embodiment. The pipeline ADC 100 is an electronic device that digitizes an analog input voltage 102 into multiple bits 114 using multiple cascaded stages 104A-104X (hereinafter collectively referred to as "stages 104"). The multiple cascaded stages 104 are connected in series.

The first stage 104A of the pipeline ADC 100 receives an input analog voltage 102 at input terminal and generates bits 106A representing a digitized value of the input analog voltage 102 at the coarsest level. The bits 106A are fed to a calibration and error correction circuit 112. The first stage 104A also generates an amplified residue voltage 108A which represents an amplified difference between the input analog voltage 102 and a voltage reconstructed by the stage 104A using the bits 106A. The subsequent stages 104B through 104X receive the amplified residue voltages 108A through 108W at their input terminals to generate bits 106B through 106X which are fed to the calibration and error correction circuit 112. Bits 106B through 106X represent progressively less significant bits of the digitized value. The first stage 104A is referred to as the highest resolution stage and the subsequent stages 104B though 104X are referred to as lower resolution stages.

The stages 104B though 104X also generate the amplified residue voltages 108B through 108X for the next stages. Each of the amplified residue voltages 108B through 108X represents an amplified voltage difference between the amplified residue voltage 108A through 108W received from the previous stage 104 and a voltage level reconstructed at the current stage 104 using the bits 106B through 106X generated at the current stage 104.

The last stage 104X is connected to a flash ADC 110 to provide the amplified residue voltage 108X to the flash ADC 110. The flash ADC 110 digitizes the amplified residue voltage 108X to generate the least significant bits 106Y of the digitized value and feeds the least significant bits 106Y to the calibration and error correction circuit 112.

Therefore, the first stage 104A starts by resolving the most significant bits 106A and the flash ADC 110 ends by resolving the least significant bits 106Y. The number of stages 104 included in the pipeline ADC 100 and the number of bits resolved by each stage 104 and the flash ADC 110 varies depending on the embodiment. For example, without accounting for redundancy, if the pipeline ADC 100 is a 12-bit ADC, the pipeline ADC 100 may include 4 stages that resolve 2 bits each and the flash ADC 110 may resolve 4 bits for a total of 12 bits. In another example, the pipeline ADC 100 may include 3 stages that resolve 3 bits each and the flash ADC 110 may also resolve 3 bits.

The calibration and error correction circuit 112 digitally calibrates and corrects deviations from intended gain values of certain stages 104 of the pipeline ADC 100. The deviations from the intended gain values are referred to as the gain errors. In order for the pipeline ADC 100 to generate accurate digitized bits 114, a calibrated stage 104 should amplify its residue voltage by a certain gain value. Taking an example of a stage 104 that resolves 1.5 bits, the residue voltage should be amplified by a gain value of 2. However, the actual gain value of the stage 104 may deviate from the ideal gain value. Such deviance (i.e., gain error) may cause errors in the bits 106 resolved by the subsequent stages 104.

In one embodiment, the calibration and error correction circuit 112 calibrates a certain number of the higher resolution stages 104 to account for the gain error of those stages 104. In FIG. 1, stages 104A through 104N are calibrated to account for the gain errors of these stages, while stages 104O through 104X and the flash ADC 110 are not calibrated. The non-calibrated stages and the flash ADC 110 are collectively referred to herein as the "uncalibrated backend ADC 116." Stages 104O through 104X of the backend ADC 116 do not need to be calibrated because the performance requirements of these stages 104 are relaxed and as a result their gain errors have a negligible effect on the accuracy of the output 114. The calibration and error correction circuit 112 calibrates by correcting the bits 106A through 106N output by the calibrated stages 104A through 104N. The calibration and error correction circuit 112 outputs the digitized bits 114 of the pipeline ADC 100.

Figure 2:
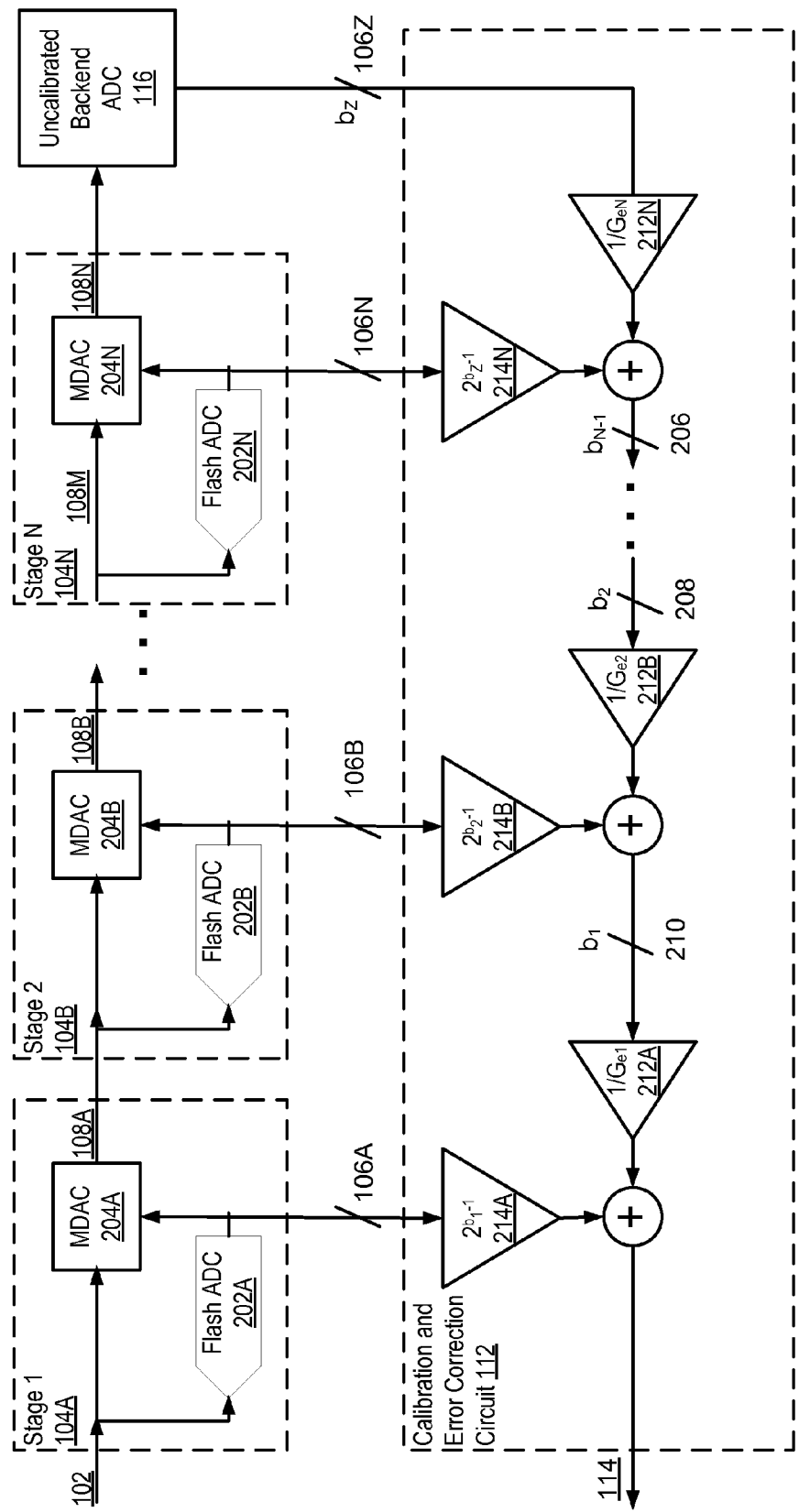
FIG. 2 is a block diagram illustrating stages and a calibration and error correction circuit of a pipeline ADC in more detail, according to one embodiment.

FIG. 2 is a block diagram illustrating the stages 104 and the calibration and error correction circuit 112 of the pipeline ADC 100 in more detail, according to one embodiment. Each stage 104A through 104X of the pipeline ADC 100 includes a flash ADC 202A through 202X (not all shown) and a multiplying digital-to-analog converter (MDAC) 204A through 204X (not all shown). The flash ADC 202 of each stage 104 digitizes a received voltage to generate the bits 106 of the stage 104. The flash ADC 202A of the first stage 104A digitizes the input voltage 102 and the flash ADCs 202B through 202X of the subsequent stages 104B through 104X digitize an amplified residue voltage 108A through 108W received from a higher resolution stage 104 in the series of stages 104. As an example, the flash ADC 202B of the second stage 104B digitizes the amplified residue voltage 108A output by the first stage 104A.

The MDAC 204 of a stage 104 amplifies the difference between the voltage digitized by the flash ADC 202 and a voltage reconstructed based on the bits 106 of the stage 104 (i.e., the MDAC 204 amplifies the residue voltage of the stage 104). In one embodiment, the MDACs 204 are implemented as switched capacitor circuits, as described below in detail with reference to FIG. 3. Non-idealities of an MDAC 204 (e.g., capacitor mismatches and amplifier DC gain) cause a gain error $G_e$ in the transfer function of the MDAC 204. The gain error $G_e$ is the ratio between the intended amplification of the residue voltage and the actual amplification of the residue voltage. The MDAC 204 of each stage 104 may have a different gain error Ge.

The calibration and error correction circuit 112 performs digital computations to account for the gain errors $G_e$ of the calibrated stages 104A through 104N and correct those stages' bits 106A through 106N. For each calibrated stage 104A through 104N, the calibration and error correction circuit 112 calculates a calibration coefficients $1/G_e$ and uses the calibration coefficient $1/G_e$ to account for the stage's gain error $G_e$. In one embodiment, the digital gain calibration coefficient $1/G_e$ of a stage 104 is the inverse of the stage's gain error $G_e$. The digital gain calibration coefficients $1/G_e$ of calibrated stages 104A through 104N are represented by elements 212A through 212N in FIG. 2.

In one embodiment, the calibration and error correction circuit 112 first accounts for the gain error $G_{eN}$ of lowest resolution calibrated stage 104N. The bits 106Z output by the uncalibrated backend ADC 116 (stages 104O through 104X and the flash ADC 110) are multiplied by the calibration coefficient $1/G_{eN}$ 212N of stage 104N. The bits 106Z multiplied by the calibration coefficient $1/G_{eN}$ 212N are summed with the bits 106N of the stage 104N multiplied by $2^{(b_z-1)}$ 214N, where $b_z$ is the resolution of the uncalibrated backend ADC 116. The result of the summation is the corrected bits 206 of the stage 104N and the backend ADC 116. The corrected bits 206 are used to account for the gain error $G_e$ of the next higher resolution stage 104 in the series of stages 104.

Each of the higher resolution stages, such as 104A and 104B, sees a backend ADC that is composed of the lower resolution calibrated stages 104 and the uncalibrated backend ADC 116. The calibration and error correction circuit 112 accounts for the gain error $G_e$ of each higher resolution calibrated stage 104 by multiplying the corrected bits of its backend ADC (the lower resolution calibrated stages 104 and the backend ADC 116) by the stage's 104 calibration coefficient $1/G_e$ 212. Additionally, the multiplied corrected bits are summed with the bits 106 of the stage 104 multiplied by $2^{(b-1)}$ 214, where "b" is the resolution of its backend ADC.

For example, to account for the gain error $G_{e1}$ of the first stage 104A, the corrected bits 210 of its backend ADC (that is composed of the calibrated stages 104B through 104N and the backend ADC 116) are multiplied by the calibration coefficient $1/G_{e1}$ 212A of the first stage 104A. Further, the multiplied bits are summed with the first stage's 104A bits multiplied by $2^{(b_1-1)}$ 214A, where $b_1$ is the resolution of its backend ADC. The result of the summation are the bits 114 output by the pipeline ADC 100. Therefore, the gain errors are accounted for in a nested fashion.

Example Flash ADC

Figure 5:
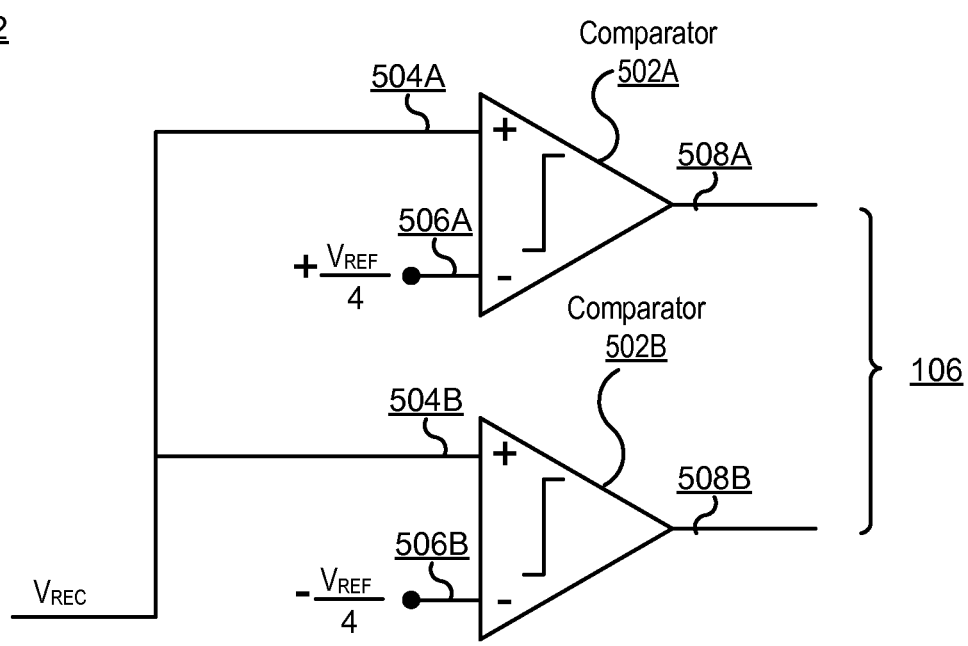
FIG. 5 is a circuit diagram of a flash ADC included in a stage, according to one embodiment.

FIG. 5 is a circuit diagram illustrating a flash ADC 202 included in each of the stages 104A through 104X, according to one embodiment. In one embodiment, the stages 104 are 1.5 bit stages and the flash ADC 202 of each stage 104 includes two comparators 502A and 502B (hereinafter collectively referred to as "comparators 502").

The non-inverting input 504A and 504B of each comparator 502 receives a voltage $V_{REC}$ received by the stage 104 of the flash ADC 202 for digitizing. That is, the stage received voltage $V_{REC}$ may be input voltage 102 (in the case of stage 104A) or residue voltage 108A through 108W (in the case of stages 104B through 104X). In one embodiment, the inverting input 506A of comparator 502A is connected to one fourth of a positive reference voltage ($+V_{REF}/4$) and the inverting input 506B of comparator 502B receives one fourth of a negative reference voltage ($-V_{REF}/4$). Each comparator 502 outputs a bit at its respective output 508A and 508B based on the stage received voltage $V_{REC}$ and the voltage connected to its inverting input 506. The bits output by the two comparators 502 are the bits 106 output by the stage 104 to the calibration and error correction circuit 112.

In one embodiment, when comparator 502A receives the stage received voltage $V_{REC}$, it determines whether the stage received voltage $V_{REC}$ is greater than $+V_{REF}/4$. If stage received voltage $V_{REC}$ is less than $+V_{REF}/4$, the comparator 502A outputs a low bit (0) at its output 508A. However, if the stage received voltage $V_{REC}$ is greater than $+V_{REF}/4$, the comparator 502A outputs a high bit (1). Similarly, when comparator 502B receives the stage received voltage $V_{REC}$, it determines whether the stage received voltage $V_{REC}$ is greater than $-V_{REF}/4$. If stage received voltage $V_{REC}$ is less than $-V_{REF}/4$, the comparator 502B outputs a low bit (0) at its output 508B. On the other hand, if the stage received voltage $V_{REC}$ is greater than $-V_{REF}/4$, the comparator 502B outputs a high bit (1). Therefore, for the stage received voltage $V_{REC}$ with a range from negative reference voltage ($-V_{REF}$) to positive reference voltage ($+V_{REF}$), there are three possible combinations of bits 106 that may be output by the two comparators 502: 00, 10, and 11.

Each combination of bits 106 output by the comparators 502 is associated with a voltage range. The bits 106 have a value of 00 when the stage received voltage $V_{REC}$ is between the negative reference voltage and one fourth of the negative reference voltage. This range is referred to as "range Y" hereafter. The bits 106 have a value of 10 when the stage received voltage $V_{REC}$ is between one fourth of the negative reference voltage and one fourth of the positive reference voltage. This range is referred to as "range Z" hereafter. Lastly, the bits 106 have a value of 11 when the stage received voltage $V_{REC}$ is between one fourth of the positive reference voltage and the positive reference voltage. The range is referred to as "range X" hereafter. The bits 106 output by the comparators 502 are used by the calibration and error correction circuit 112 to output a digitized value 114 of the input analog voltage 102 received by the pipeline ADC 100, as described with reference to FIG. 2.

Example Switched-Capacitor Circuit

Figure 3A:
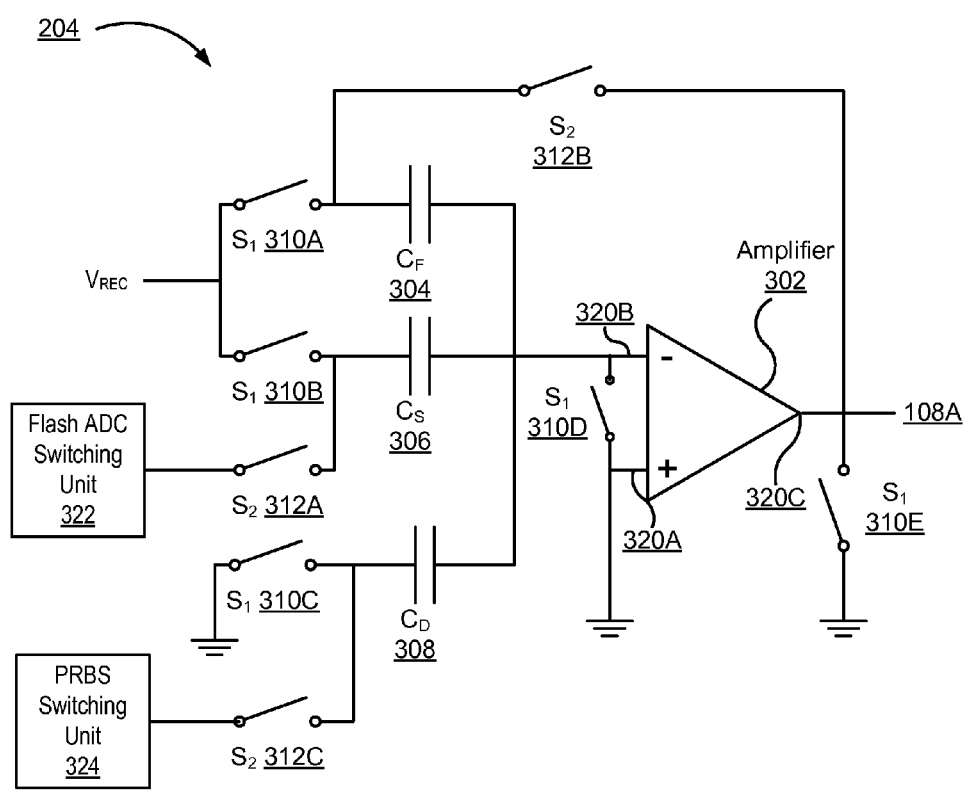
FIGS. 3A through 3C are diagrams of a switched-capacitor circuit that performs the functions of a multiplying digital-to-analog converter included in a calibrated stage, according to one embodiment.

FIG. 3A is a circuit diagram illustrating the MDAC 204A through 204N of a calibrated stage 104A through 104N embodied as a switched-capacitor circuit, according to one embodiment. The MDAC 204 of a calibrated stage may include, among other components, an amplifier 302, a feedback capacitor $C_F$ 304, a sampling capacitor $C_S$ 306, a dither capacitor $C_D$ 308, a first set of switches $S_1$ 310A through 310E (hereinafter collectively referred to as "first set of switches 310"), a second set of switches $S_2$ 312A through 312C (hereinafter collectively referred to as "second set of switches 312"), a flash ADC switching unit 322, and a PRBS switching unit 324.

One terminal of each capacitor 304, 306, 308 is connected to the inverting input 320B of the amplifier 302. The second terminal of feedback capacitor $C_F$ 304 is connected to switches $S_1$ 310A and $S_2$ 312B. The second terminal of sampling capacitor $C_S$ 306 is connected to switches $S_1$ 310B and $S_2$ 312A. The second terminal of dither capacitor $C_D$ 308 is connected to switches $S_1$ 310C and $S_2$ 312C. In one embodiment, an MDAC 204 with the same circuit as that of FIG. 3A is used for each uncalibrated stage 104O through 104X included in the uncalibrated backend ADC 116 except that the MDAC 204 does not include the dither capacitor $C_D$ 308, switches $S_1$ 310C and $S_2$ 312C, and the PRBS switching unit 324.

Through the use of the first set of switches 310 and the second set of switches 312, the MDAC 204 may be placed in a sampling phase or in an amplification phase of the operational mode. The MDAC 204 is placed in a sampling phase while the flash ADC 202 of the stage 104 is digitizing a voltage received at its input terminal (e.g., input voltage 102 for the first stage 104A). The MDAC 204 is then placed in an amplification phase after the flash ADC 202 digitizes the voltage in order to generate the amplified residue voltage 108 for feeding the next stage 104. After the amplification phase, the MDAC 204 may return to the sampling phase.

Figure 3B:
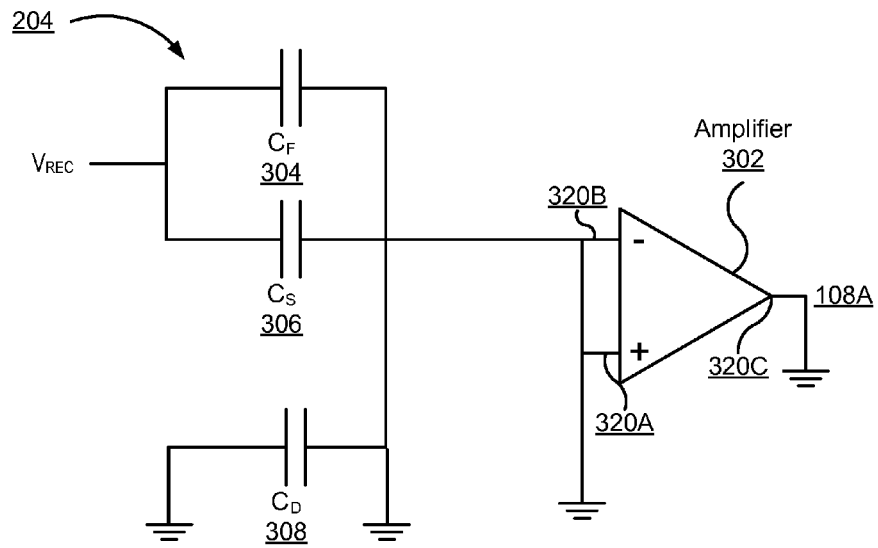

FIG. 3B is a circuit diagram illustrating the MDAC 204 in the sampling phase, according to one embodiment. During the sampling phase of the MDAC 204, the first set of switches $S_1$ 310 is closed and the second set of switches $S_2$ 312 is opened. Closing the first set of switches $S_1$ 310 causes the second terminal of the feedback capacitor $C_F$ 304 and the sampling capacitors $C_S$ 306 to be connected to a voltage $V_{REC}$ received at the input terminal of the stage 104 and the second terminal of the dither capacitor $C_D$ 308 to be connected to ground.

Figure 3C:
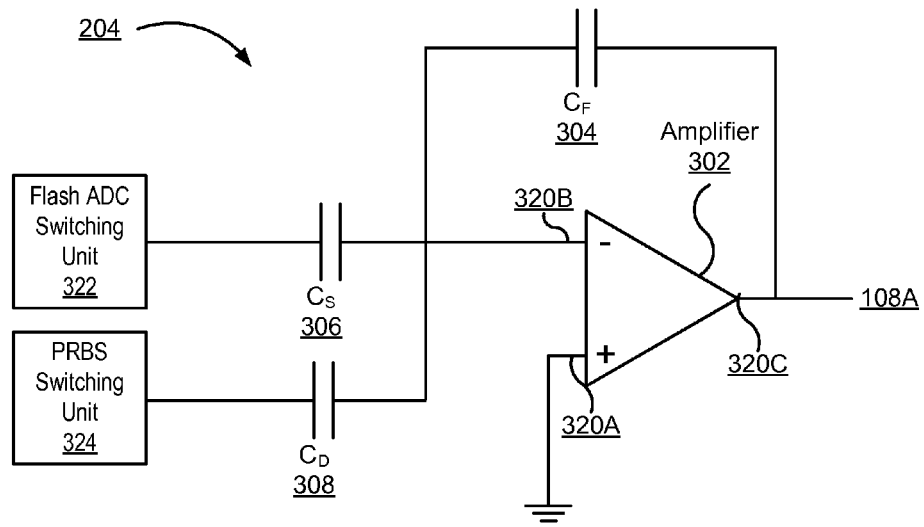

FIG. 3C is a circuit diagram illustrating the MDAC 204 in the amplification phase of the operational mode subsequent to the sampling phase of the operational mode, according to one embodiment. During the amplification phase of the MDAC 204, the first set of switches 310 is opened and the second set of switches 312 is closed. The amplification phase results in the second terminal of the feedback capacitor $C_F$ 304 becoming connected to the output 320C of the amplifier 302 and the second terminal of the second terminal of the dither capacitor $C_D$ becoming connected to the PRBS switching unit 324. As described in the background calibration section below, in operational mode, through the PRBS switching unit 324 a Pseudo-Random Binary Sequence (PRBS) may be injected through the dither capacitor $C_D$ 308 for background calibration depending on the output 106 of the flash ADC 202.

Further, in the amplification phase, the sampling capacitor $C_S$ 306 connects to the flash ADC switching unit 322. Through the flash ADC switching unit 322, the sampling capacitor $C_S$ 306 may receive a positive reference voltage ($+V_{REF}$), a negative reference voltage ($-V_{REF}$) or ground, depending on the bits 106 output by the flash ADC 202.

Figure 6:
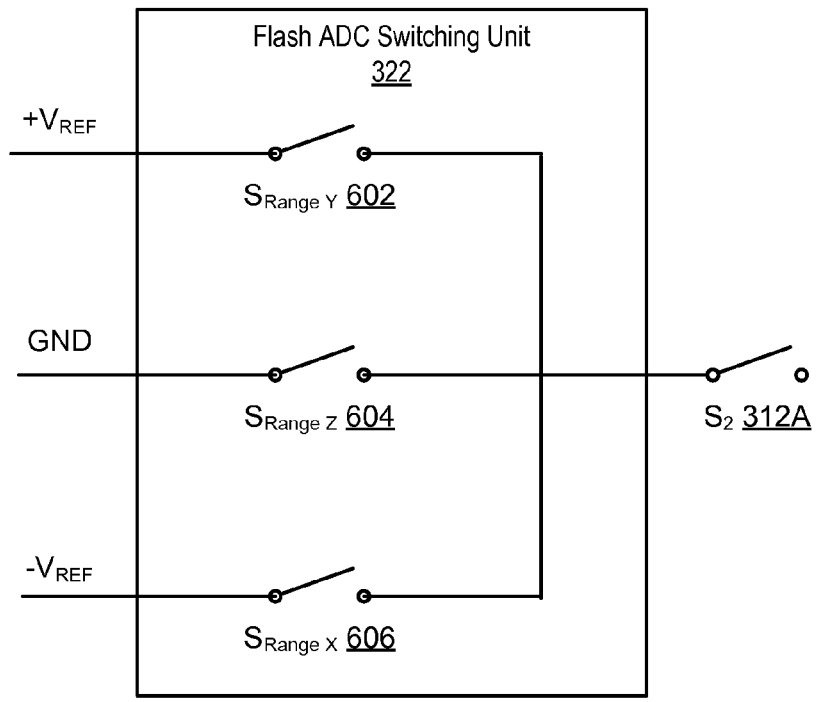
FIG. 6 is a circuit diagram of a flash ADC switching unit included in an MDAC of a stage, according to one embodiment.

FIG. 6 is a circuit diagram illustrating the flash ADC switching unit 322 in an MDAC 204 of a stage 104, according to one embodiment. The flash ADC switching unit 322 may include, among other components, the following three switches: range Y switch ($S_{Range\ Y}$) 602, range Z switch ($S_{Range\ Z}$) 604, and range X switch ($S_{Range\ X}$) 606. A second terminal of each of switches 602 through 606 is connected to the sampling capacitor $C_S$ 306 via switch 312 of FIG. 3A. A first terminal of the range Y switch 602 is connected to a positive reference voltage ($+V_{REF}$). A first terminal of the range Z switch 604 is connected to ground (GND) and a first terminal of the range X switch 606 is connected to a negative reference voltage ($-V_{REF}$).

In one embodiment, when the MDAC 204 is in the amplification phase of the operational mode and the bits 106 output by the flash ADC 202 of the stage 104 indicate that the voltage $V_{REC}$ received at the input terminal of the stage 104 is within range Y ($-V_{REF}$ to $-V_{REF}/4$), the range Y switch 602 is closed and the range Z switch 604 and range X switch 606 are maintained in the open position. As a result, the second terminal of the sampling capacitor $C_s$ is connected to the positive reference voltage ($+V_{REF}$).

When the MDAC 204 is in the amplification phase and the bits 106 output by the flash ADC 202 indicate that the stage received voltage $V_{REC}$ is within range Z ($-V_{REF}/4$ to $+V_{REF}/4$), the range Z switch 604 is closed and the range Y 602 and range X 606 switches are opened. As a result, the second terminal of the sampling capacitor $C_s$ 306 is connected to ground.

Further, when the MDAC 204 is in the amplification phase and the output bits 106 indicate that the stage received voltage $V_{REC}$ is within range X ($+V_{REF}/4$ to $+V_{REF}$), the range X switch 606 is closed and the range Y 602 and range Z 604 switches are opened. As a result of closing the range X switch 606, the second terminal of the sampling capacitor $C_s$ 306 is connected to the negative reference voltage ($-V_{REF}$).

Example Calibration for MDAC of Calibrated Stages

As discussed above in detail with reference to FIG. 2, for each calibrated stage 104A through 104N, a digital gain calibration coefficient $1/G_e$ is calculated by the calibration and error correction circuit 112 to account for the gain error $G_e$ of the MDAC 204 included in the stage 104. The gain error $G_e$ of the MDAC 204 is caused, for example, by the DC gain of the amplifier 302 and mismatches of $C_F$ 304 and $C_S$ 306.

During calibration, the calibration and error correction circuit 112 determines the calibration coefficient $1/G_e$ of each stage 104 using the MDAC 204 of the stage 104. In one embodiment, calibration can be performed in calibration mode, the operational mode or both modes.

Background calibration herein refers to the calibration of the stages 104 performed by the calibration and error correction circuit 112 while the pipeline ADC 100 is in the operational mode. During the operational mode, the pipeline ADC 100 uses the stages 104 to digitize an input voltage 102 into bits 114. Therefore, during this mode the flash ADCs 202 digitize and MDACs 204 go through the sampling and amplification phases. On the other hand, foreground calibration refers to the calibration of the stages 104 performed while the pipeline ADC 100 is in the calibration mode. The calibration mode occurs during the startup time of the pipeline ADC 100 when the pipeline ADC 100 is not yet operational to receive an input voltage 102 and produce the bits 114. In one embodiment, in the calibration mode, the input 102 to the pipeline ADC 100 is ignored and the MDACs 204 of the stages 104 go through the sampling and amplification phases in order to determine the calibration coefficients $1/G_e$ of the calibrated stages.

In one embodiment, the calibration and error correction circuit 112 performs foreground calibration to generate initial calibration coefficients $1/G_e$ and background calibration to update the initial calibration coefficients)/$G_e$. The background calibration allows the correction circuit 112 to adjust the calibration coefficients)/$G_e$ in order to account for changes in the stages' gain errors $G_e$ which occur while the ADC 100 is operating in an operational mode due, for example, to temperature and supply voltage changes.

In another embodiment, the calibration and error correction circuit 112 performs foreground calibration without performing background calibration. In this embodiment, the calibration coefficients $1/G_e$ are determined during the startup time of the pipeline ADC 100. In another embodiment, the calibration and error correction circuit 112 performs background calibration without performing foreground calibration. In this embodiment, the calibration coefficients $1/G_e$ are initially set to certain values and the coefficients are updated during background calibration.

Foreground Calibration

In one embodiment, to determine the calibration coefficient $1/G_e$ of a calibrated stage 104A through 104N during foreground calibration, zero volts are sampled during the sampling phase of the stage's MDAC 204 and a switching scheme is applied to sampling capacitor $C_S$ 306 of the MDAC 204 during the amplification phase. In one embodiment, sampling capacitor $C_S$ 306 is implemented using multiple sub-capacitors connected in parallel. In one embodiment, each of the sub-capacitors is nominally equal to the dither capacitor $C_D$ 308.

Therefore, in this embodiment, the number of sub-capacitors that make up the sampling capacitor $C_S$ 306 depends on the size of the sampling capacitor $C_S$ 306 and the size of the dither capacitor $C_D$ 308. For example, for a 1.5 bit stage with capacitors $C_F$ 304 and $C_S$ 306 having a value of C and the dither capacitor $C_D$ 308 having a value of C/4, four sub-capacitors, each with a value of C/4 would be used to collectively form capacitor $C_S$ 306.

In one embodiment, the switching scheme used to calculate the calibration coefficient $1/G_e$ of the calibrated stage 104 is applied to the sub-capacitors of capacitor $C_S$ 306 during the amplification phase of the MDAC 204. The switching scheme includes performing at least N measurements of the amplified residue voltage 108 of the stage 104 (voltage at output 320C of the amplifier 302), where N is the number of sub-capacitors making up capacitor $C_S$ 306. In each of the N measurements, N−1 of the sub-capacitors are connected to the positive reference voltage (+$V_{REF}$), one of the sub-capacitors is connected to ground, dither capacitor $C_D$ 308 is connected to ground, and feedback capacitor $C_F$ 304 is connected to the output 320C of the amplifier 302. A different sub-capacitor is connected to ground during each of the N measurements. Therefore, during the N measurements in a cycle of foreground calibration, each sub-capacitor is connected to ground once.

In another embodiment, instead of connecting one the sub-capacitors to ground during each measurement, a sub-capacitor is connected to a reference voltage that is different from the positive reference voltage (+$V_{REF}$). For example, the different reference voltage may be a value that is less than the positive reference voltage (+$V_{REF}$). Therefore, in this embodiment, during each measurement, N−1 of the sub-capacitors are connected to the positive reference voltage (+$V_{REF}$) and one of the sub-capacitors is connected to the different reference voltage.

In one embodiment, the measurements are performed by the subsequent stage 104 in the pipeline ADC 100 and provided to the calibration and error correction circuit 112 for calculation of the calibration coefficient $1/G_e$ of the calibrated stage 104. In one embodiment, the measurements are provided to the calibration and error correction circuit 112 in a digital form. The calibration and error correction circuit 112 averages the N measurements of the amplified residue voltages 108 and calculates the calibration coefficient $1/G_e$ of the calibrated stage 104 using the equation below, where $V_{OMEASavg}$ is the average of the N measurements.

$$1/G_e = \frac{\left(\frac{N-1}{N}\right) * V_{REF}}{V_{OMEASavg}} \quad (1)$$

In one embodiment, an additional measurement (N+1 measurement) of the amplified residue voltage 108 is made to determine the mismatch between dither capacitor $C_D$ 308 and sampling capacitor $C_S$ 306. The mismatch is used during background calibration to remove the injected PRBS, as described in the background calibration section below. If the mismatch is not determined during foreground calibration, the mismatch is assumed to be zero during background calibration. Assumption that the mismatch is zero will result in an inaccurate calculation of a calibration coefficient $1/G_e$ during the background calibration. To perform the N+1 measurement of the amplified residue voltage 108, each of the sub-capacitors is connected to the positive reference voltage (+$V_{REF}$), dither capacitor $C_D$ 308 is connected to the negative reference voltage (−$V_{REF}$), and feedback capacitor $C_F$ 304 remains connected to the output 320C of the amplifier 302. The calibration and error correction circuit 112 calculates the mismatch of dither capacitor $C_D$ 308 and sampling capacitor $C_S$ 306 by taking the ratio of the amplified residue voltage 108 measured during the N+1 measurement and $V_{OMEASavg}$.

Figure 4A:
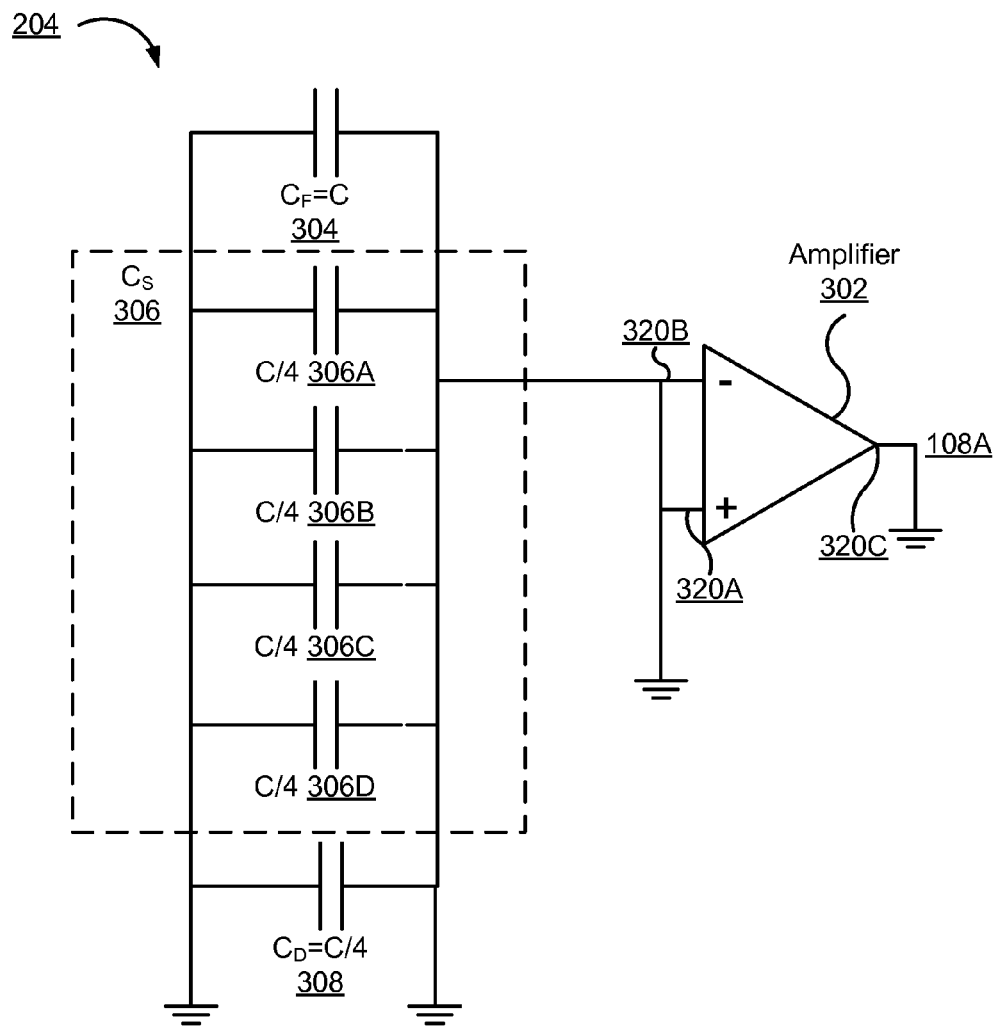
FIGS. 4A and 4B are diagrams of a multiplying digital-to-analog converter included in a 1.5 bit calibrated stage, according to one embodiment.

As an example of the calculations performed for a calibrated stage 104, assume that (i) the MDAC 204 is used for a 1.5 bit calibrated stage, (ii) capacitors $C_F$ 304 and $C_S$ 306 have a capacitance of C, (iii) dither capacitor $C_D$ 308 has capacitance of C/4, and (iv) the sampling capacitor $C_S$ 306 is made up of four sub-capacitors of equal capacitance (C/4). FIG. 4A illustrates the MDAC 204 in the sampling phase according to this example. As can be seen in FIG. 4A, sampling capacitor $C_S$ 306 is made up of four sub-capacitors 306A through 306D of nominally equal value. Additionally, it can be seen that the voltage at the input terminal of the stage is 0V.

During the amplifying phase of the MDAC 204, four measurements are taken at the output 320C of the amplifier 302 while changing the sub-capacitor 306A through 306D connected to ground. The four measurements are sent to the calibration and error correction circuit 112 to calculate the calibration coefficient $1/G_e$ of the stage 104. A fifth measurement is also made at the output 320C to determine the mismatch of capacitors $C_D$ 308 and $C_S$ 306.

Figure 4B:
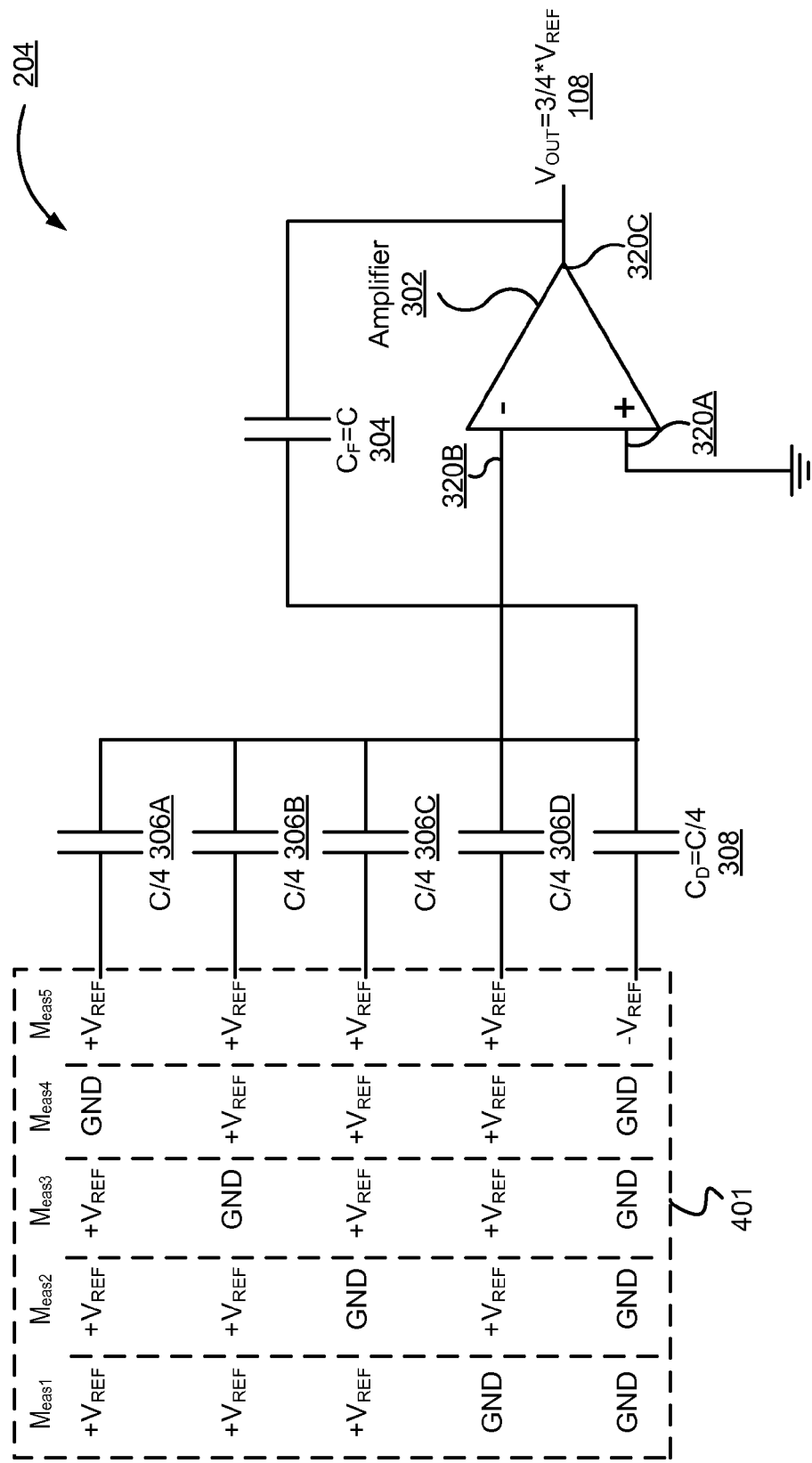

FIG. 4B illustrates how the sub-capacitors 306A through 306D and $C_D$ 308 are connected throughout the five measurements (Meas1 through Meas5), according to one embodiment. During the first four measurements (Meas1 through Meas4), each of the sub-capacitors is connected to ground once while the other sub-capacitors are connected to the positive reference voltage (+$V_{REF}$) as shown in a corresponding column of table 401.

Specifically, for the first measurement (Meas1), sub-capacitor 306D and the dither capacitor $C_D$ 308 are connected to ground (GND) while sub-capacitors 306A through 306C are connected to the positive reference voltage (+$V_{REF}$). For the second measurement (Meas2), sub-capacitor 306C and dither capacitor $C_D$ 308 are connected to ground (GND) while sub-capacitors 306A, 306B, and 306D are connected to the positive reference voltage (+$V_{REF}$). For the third measurement (Meas3), sub-capacitor 306B and the dither capacitor $C_D$ 308 are connected to ground (GND) while sub-capacitors 306A, 306C, and 306D are connected to the positive reference voltage (+$V_{REF}$). For the fourth measurement (Meas4) sub-capacitor 306A and the dither capacitor $C_D$ 308 are connected to ground (GND) while sub-capacitors 306B, 306C, and 306D are connected to the positive reference voltage (+$V_{REF}$). For the fifth measurement (Meas5) sub-capacitors 306A through 306D are connected to the positive reference voltage (+$V_{REF}$) and dither capacitor $C_D$ 308 is connected to the negative reference voltage (−$V_{REF}$).

Because one of the sub-capacitors is connected to ground each time the output voltage 108 for the first four measurements Meas1 through Meas4, the output residue voltage 108 is near $((N-1)/N)*V_{REF}$, where N is the number of sub-capacitors that make up sampling capacitor $C_S$ 306. In the example of FIG. 4B, N equals four. Therefore, in this example, the output residue voltage 108 is near ¾ of the full output scale, which is a representative range for normal operation of the amplifier 302. This avoids the extremes of the output range of the amplifier 302. Forcing the amplifier 302 into the extremes of the output range may cause an error in the measured amplified residue voltage 108 and also result in errors in the calculated calibration coefficient $1/G_e$.

The equations below show how the gain error of this 1.5-bit calibrated stage is calculated by the calibration and error correction circuit 112. Since capacitor $C_S$ 306 is divided into four equally sized capacitors, the representative equation of capacitor $C_S$ 306 is expressed by the following equation:

$$C_S = \sum_{i=1}^{4} \left( \frac{C}{4} + \delta C_i \right) \qquad (2)$$

where $\delta C_i$, (i=1 ... 4) is the mismatch error as to how much each sub-capacitor deviates from its ideal value (C/4).

The amplified residue voltage 108 of the 1.5 bit stage is expressed by the following equation:

$$v_{OUT} = G_e \left[ \left(1 + \frac{C_S}{C_F}\right) V_{IN} - d \frac{C_S}{C_F} V_{REF} - r \frac{C_D}{C_F} V_{REF} \right] \qquad (3)$$

where $V_{IN}$ is the input voltage 102, d={−1,0,+1} is the decision of the flash ADC 202 and r={−1,+1} is the PRBS (when the capacitor $C_D$ 308 is unused, r=0).

The output voltages 108 of the first four measurements is (using $V_{IN}$=0, d=−1, r=0) are expressed by the following equations:

$$v_{OMEAS1} = G_e \frac{\sum_{i=1}^{3}\left(\frac{C}{4} + \delta C_i\right)}{C_F} V_{REF} \qquad (4)$$

$$v_{OMEAS2} = G_e \frac{\sum_{i=1}^{2}\left(\frac{C}{4} + \delta C_i\right) + \left(\frac{C}{4} + \delta C_4\right)}{C_F} V_{REF} \qquad (5)$$

$$v_{OMEAS3} = G_e \frac{\sum_{i=3}^{4}\left(\frac{C}{4} + \delta C_i\right) + \left(\frac{C}{4} + \delta C_1\right)}{C_F} V_{REF} \qquad (6)$$

$$v_{OMEAS4} = G_e \frac{\sum_{i=2}^{4}\left(\frac{C}{4} + \delta C_i\right)}{C_F} V_{REF} \qquad (7)$$

The average of the four measurements is:

$$v_{OMEASavg} = \frac{v_{OMEAS1} + v_{OMEAS2} + v_{OMEAS3} + v_{OMEAS4}}{4} \qquad (8)$$

The measured calibration coefficient $1/G_{eMEAS}$ of the 1.5 bit calibrated stage is given by:

$$1/G_{eMEAS} = \frac{3/4 V_{REF}}{v_{OMEASavg}} \qquad (9)$$

Equations 10 and 11 below show how the mismatch between capacitors $C_D$ 308 and $C_S$ 306 is calculated. Using $V_{IN}$=0, d=−1, r=1 in equation 3, the output voltage 108 of the fifth measurement can be expressed as follows:

$$v_{OMEAS5} = G_e V_{REF} \left[ \frac{C_S}{C_F} - \frac{C_D}{C_F} \right] \qquad (10)$$

The ratio between $C_D$ 308 and $C_S$ 306 is given by:

$$\frac{C_D}{C_S} = 1 - \frac{3}{4} \frac{v_{OMEAS5}}{v_{OMEASavg}} \qquad (11)$$

By using the switching scheme described above with reference to FIG. 4B, the calibration coefficient $1/G_e$ of the calibrated stage 104 can be determined accurately. An accurate determination of the calibration coefficient $1/G_e$ allows, among other things, a relaxed design of the amplifier 302 because it can be simpler and be optimized for lower power consumption. Additionally, an accurate determination of the mismatch between the dither capacitor $C_D$ 308 and the sampling capacitor $C_S$ 306 allows improved performance during background calibration.

In one embodiment, a cycle of foreground calibration begins with determining the calibration coefficient $1/G_e$ of the lowest resolution calibrated stage 104N. After the calibration coefficient $1/G_e$ of stage 104N is determined, the calibration coefficient $1/G_e$ of each of the higher resolution stages is determined in successive order.

Background Calibration

The background calibration is performed while the pipeline ADC 100 is in the operational mode (e.g., while digitizing the input voltage 102). In one embodiment, to perform background calibration of a calibrated stage 104, the PRBS switching unit 324 of FIG. 3C injects a PRBS through the dither capacitor $C_D$ 308 of the stage's 104 MDAC in the amplification phase of the operational mode to enable the calibration and error correction circuit 112 to determine the calibration coefficient $1/G_e$ of the stage 104, as further detailed below. However, in order to reduce the swing of the amplified residue voltage output by the calibrated stage 104, the PRBS switching unit 324 injects a PRBS through the dither capacitor only if a voltage $V_{REC}$ received by the stage 104 (stage received voltage) is within a certain range.

Figure 7:
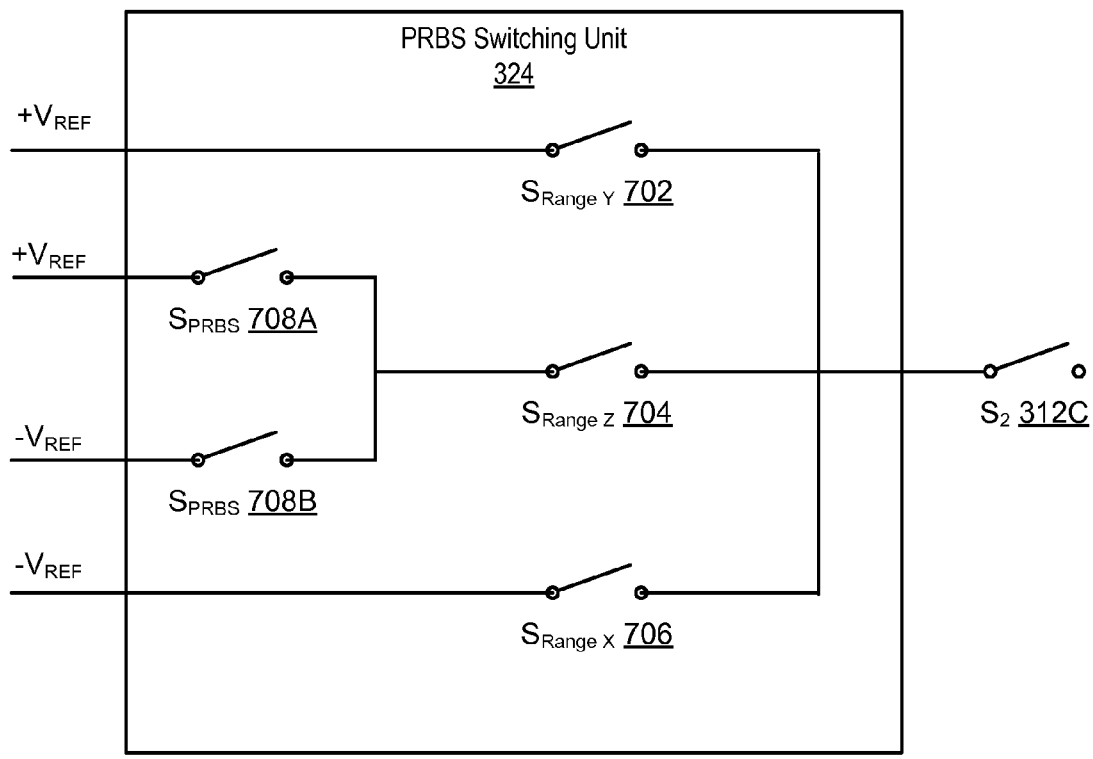
FIG. 7 is a circuit diagram of a PRBS switching unit included in an MDAC of a calibrated stage, according to one embodiment.

FIG. 7 is a circuit diagram of the PRBS switching unit 324 included in an MDAC 204 of a calibrated stage 104, according to one embodiment. The PRBS switching unit 324 includes a range Y switch ($S_{Range\_Y}$) 702, range Z switch ($S_{Range\_Z}$) 704, and range X switch ($S_{Range\_X}$) 706. A first terminal of the range Y switch 702 is connected to a positive reference voltage (+$V_{REF}$) and the first terminal of the range X switch 706 is connected to a negative reference voltage (−$V_{REF}$). Further, a first terminal of the range Z switch 704 is connected to a second terminal of two PRBS switches ($S_{PRBS}$) 708A and 708B. The first terminal of PRBS switch 708A is connected to the positive reference voltage (+$V_{REF}$) and the first terminal of PRBS switch 708B is connected to the negative reference voltage (−$V_{REF}$). A second terminal of range switches 702 through 706 is connected to switch 312C of FIG. 3A, which is connected to the second terminal of the dither capacitor $C_D$ 308.

In the amplification phase of the operational mode of the calibrated stage 104, the PRBS switching unit 324 determines whether to inject a PRBS based on the bits 106 output by the flash ADC 202 during the sampling phase. In one embodiment, when the MDAC 204 is in the amplification phase of the operational mode and the bits 106 output by the flash ADC 202 indicate that the voltage $V_{REC}$ received at the input terminal of the stage 104 is within range Y (−$V_{REF}$ to −$V_{REF}/4$), the range Y switch 702 is closed and switches 704 and 706 are opened. The second terminal of the dither capacitor $C_D$ 308 becomes connected to the positive reference voltage (+$V_{REF}$). When the MDAC 204 is in the amplification phase and the output bits 106 indicate that the stage received voltage $V_{REC}$ is within range X (+$V_{REF}/4$ to +$V_{REF}$), the range X switch 706 is closed and switches 702 and 704 are opened. The second terminal of the dither capacitor $C_D$ 308 becomes connected to the negative reference voltage (−$V_{REF}$).

Further, when the MDAC 204 is in the amplification phase and the output bits 106 indicate that the stage received voltage $V_{REC}$ is within range Z (−$V_{REF}/4$ to +$V_{REF}/4$), the range Z switch 704 is closed and switches 702 and 706 are opened. As a result, the PRBS switching unit 324 injects a PRBS through the dither capacitor $C_D$ 308 by either closing PRBS switch 708A or PRBS switch 708B. In other words, the PRBS switching unit 324 injects a PRBS by connecting the second terminal of the dither capacitor $C_D$ 308 according to a bit value of the PRBS. If the bit value is the first value of the two possible values of the binary sequence, the PRBS switching unit 324 connects the second terminal of the dither capacitor $C_D$ 308 to the positive reference voltage (+$V_{REF}$). If the bit value is the second value, the PRBS switching unit 324 connects the second terminal of the dither capacitor $C_D$ 308 to the negative reference voltage (−$V_{REF}$).

By injecting the PRBS only when the stage received voltage $V_{REC}$ is within range Z and connecting the dither capacitor $C_D$ 308 to the positive reference voltage (+$V_{REF}$) when the received voltage $V_{REC}$ is in range Y and to the negative reference voltage (−$V_{REF}$) when the voltage is in range X, the PRBS switching unit 324 reduces the swing of the amplified residue voltage 108 output by the MDAC 204, as described below with reference to FIG. 8.

Figure 8:
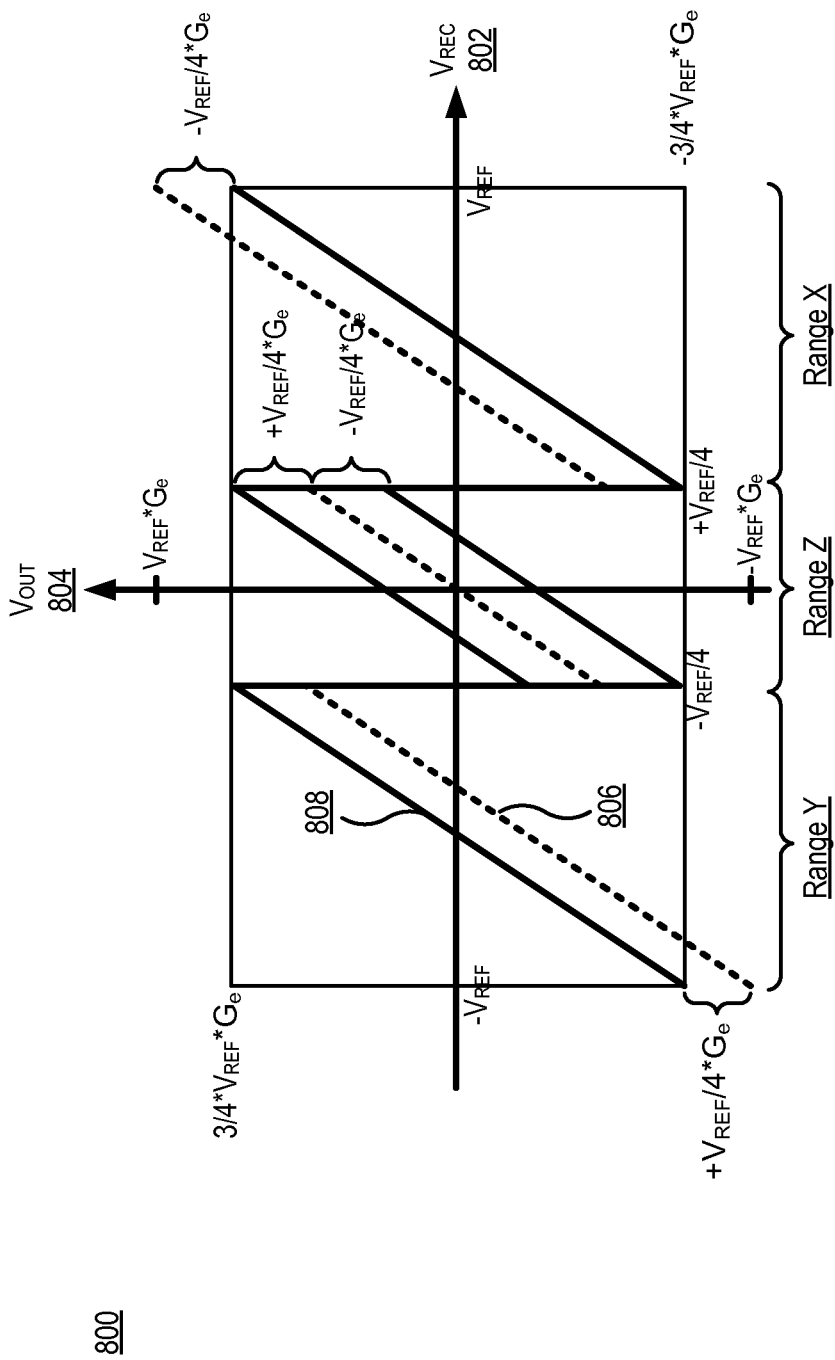
FIG. 8 is a graph comparing transfer functions of two different types of MDACs that may be included in a 1.5 bit stage, according to one embodiment.

FIG. 8 is a graph 800 comparing the transfer function of an MDAC 204 as illustrated in FIG. 3A (selective PRBS injection MDAC 204) included in a 1.5 bit stage 104 and the transfer function of a standard MDAC included in a 1.5 bit stage (a standard MDAC does not include a dither capacitor $C_D$ 308 or PRBS switching unit 324). The x-axis 802 of the graph 800 represents the voltage received $V_{REC}$ at the input terminal of the stage/MDAC and the y-axis 804 represents the amplified residue voltage output 108.

The dashed graph line 806 represents the transfer function of the standard MDAC and the solid graph line 808 represents the transfer function of the selective PRBS injection MDAC 204. As can be seen in the graph 800, when the stage received voltage $V_{REC}$ is within range Y, the lowest amplified residue voltage 108 output by the standard MDAC is the negative reference voltage times the gain error of the MDAC (−$V_{REF}*G_e$). On the other hand, for MDAC 204, the dither capacitor $C_D$ 308 shifts the transfer function up by one fourth of the positive reference voltage times the gain error of the MDAC 204 (+$V_{REF}/4*G_e$). That is, the highest amplified residue voltage 108 output by MDAC 204 in range Y is positive three fourths of the reference voltage times the gain error of the MDAC 204 (+$3/4*V_{REF}*G_e$) and the lowest output generated by MDAC 204 in the range Y is negative three fourths of the reference voltage times the gain error of the MDAC 204 (−$3/4*V_{REF}*G_e$).

When the stage received voltage $V_{REC}$ is within range X and the dither capacitor $C_D$ 308 is connected to the negative reference voltage (−$V_{REF}$), the dither capacitor $C_D$ 308 shifts the transfer function down by one fourth of the reference voltage times the gain error of the MDAC 204 (−$V_{REF}/4*G_e$). Therefore, the highest output generated by the MDAC 204 in range X is positive three fourths of the reference voltage times the gain error of the MDAC 204 (+$3/4*V_{REF}*G_e$) and the lowest output generated by MDAC 204 in range X is negative three fourths of the reference voltage times the gain error of the MDAC 204 (−$3/4*V_{REF}*G_e$).

When voltage $V_{REC}$ is within range Z and the PRBS switching unit 324 injects a PRBS through the dither capacitor $C_D$ 308, the transfer function is shifted up or down by one fourth of the reference voltage times the gain error (+$1/4*V_{REF}*G_e$). The highest amplified residue voltage 108 output by MDAC 204 in range Z is positive three fourths of the reference voltage times the gain error of the MDAC 204 (+$3/4*V_{REF}*G_e$) and the lowest output generated by MDAC 204 in range Z is negative three fourths of the reference voltage times the gain error of the MDAC 204 (−$3/4*V_{REF}*G_e$).

Therefore, the overall range of the output amplified residue voltage 108 for the transfer function 808 of the selective PRBS injection MDAC 204 is +$3/4*V_{REF}*G_e$ to −$3/4*V_{REF}*G_e$. This range is narrower than that of the standard MDAC which is from −$V_{REF}*G_e$ to +$V_{REF}*G_e$, as can be seen in the graph 800. Some of many advantages in reducing the output swing is that the settling requirements of the selective PRBS injection MDAC 204 are eased and the non-linearity of the amplifier 302 included in the MDAC 204 is decreased. Both of these characteristics results in a decrease in the power consumption of the MDAC 204.

Further, when the non-linearity of the amplifier 302 for output residue voltages 108 of ±$V_{REF}*G_e$ is not a limitation, the selective coupling of the second terminal of dither capacitor $C_D$ 308 to a reference voltage based on the stage received voltage $V_{REC}$ allows for the reference voltage to be increased, for example to $4/3*V_{REF}$ while maintaining the output swing of the stages 104 within the range of $V_{REF}*G_e$ to +$V_{REF}*G_e$. The increase in the reference voltage also increases the range of stage received voltage $V_{REC}$, which allows the use of smaller capacitors in the stages 104 to achieve the same signal-to-noise ratio. In this way, the power consumption of the MDAC 204 can be decreased.

Embodiments with Additional Comparators

Figure 9:
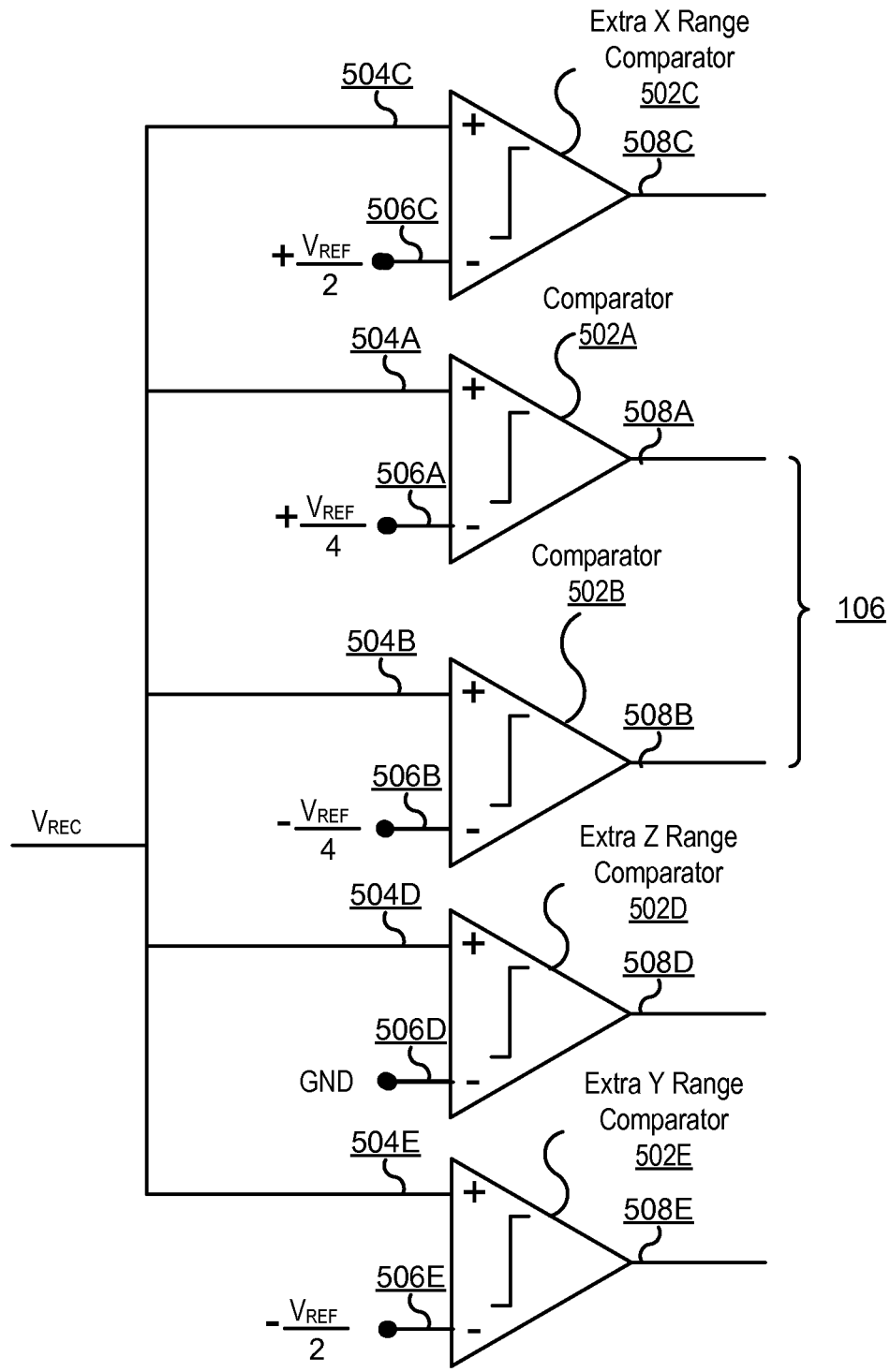
FIG. 9 is a circuit diagram of a flash ADC included in a 1.5 bit stage with additional comparators, according to one embodiment.

In one embodiment, to further decrease the amplified residue voltage swing, comparators may be added to the flash ADC 202 of the stage 104. FIG. 9 is a circuit diagram illustrating a flash ADC 202A through 204N included in a 1.5 bit calibrated stage 104A through 104N with additional comparators 502C, 502D, 506E, according to one embodiment. The flash ADC 202 of FIG. 9 includes three additional comparators 502C, 502D, 502E in addition to comparators 502A, 502B described above in detail with reference to FIG. 5.

Similar to comparators 502A, 502B, the non-inverting inputs 504C, 504D, 506E of comparators 502C, 502D, 502E, receive a voltage $V_{REC}$ received by the stage 104. The non-inverting input 506C of comparator 502C receives one half of a positive reference voltage ($+V_{REF}/2$). Therefore, the comparator 502C outputs a low bit at its output 508C when the stage received voltage $V_{REC}$ is less than $+V_{REF}/2$ and a high bit when the stage received voltage $V_{REC}$ is greater than $+V_{REF}/2$. The comparator 502C may be referred to as an extra X range comparator because $+V_{REF}/2$ is within range X.

The non-inverting input 506D of comparator 502D is connected to ground (GND) and since zero is within range Z, the comparator 502D may be referred to as an extra Z range comparator. The comparator 502D outputs a low bit at its output 508D when the stage received voltage $V_{REC}$ is less than 0 and a high bit when the stage received voltage $V_{REC}$ is greater than 0. Further, the non-inverting input 506E of comparator 502E receives negative one half of the reference voltage ($-V_{REF}/2$). The comparator 502E outputs a low bit at its output 508E when the stage received voltage $V_{REC}$ is less than $-V_{REF}/2$ and a high bit when the stage received voltage $V_{REC}$ is greater than $-V_{REF}/2$. Because $-V_{REF}/2$ is within the Y range, the comparator 502E may be referred to as an extra Y range comparator.

The comparators 502A through 502E collectively generate 5 bits of output based on the stage received voltage $V_{REC}$, one bit per comparator 502. The 5 bits are used by the PRBS switching unit 324 to determine how to connect the dither capacitor $C_D$ 308 during the amplification phase of the operational mode.

Figure 10:
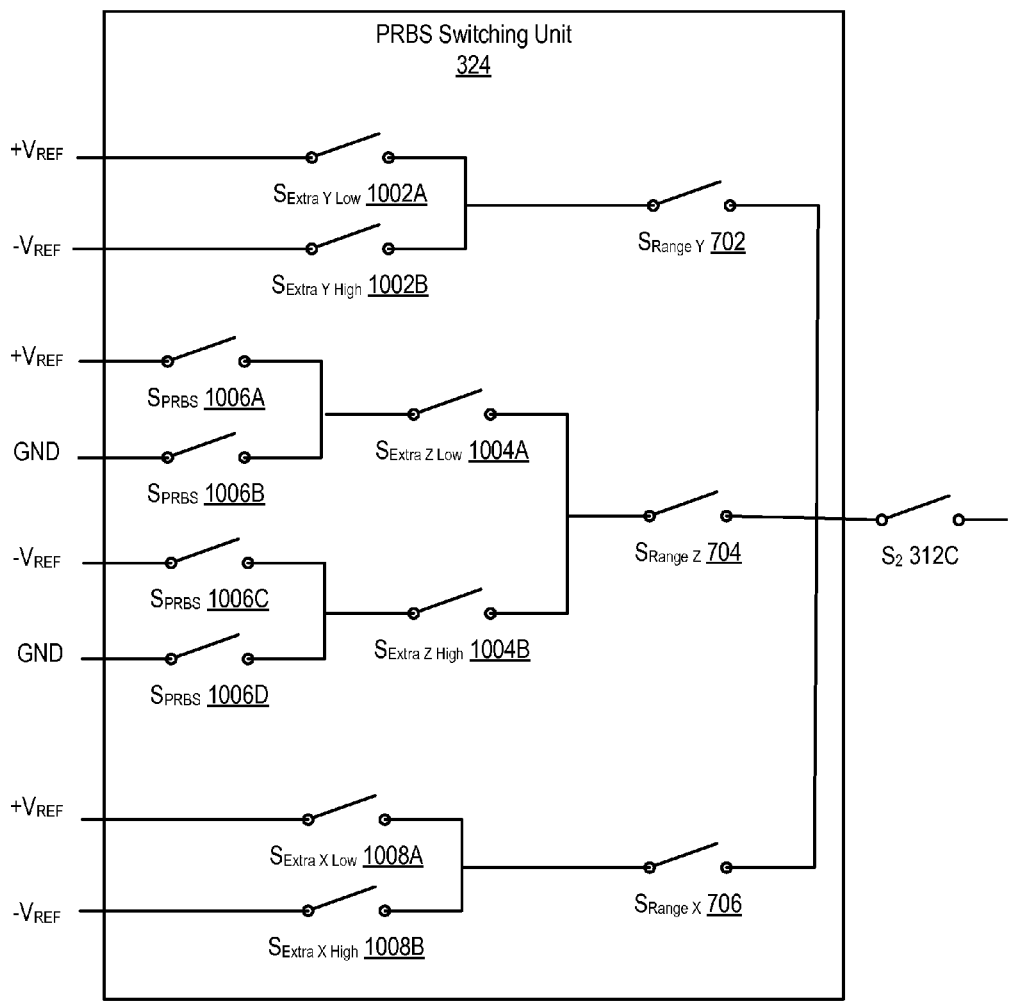
FIG. 10 is a circuit diagram illustrating a PRBS switching unit included in an MDAC of a calibrated stage when the flash ADC of the stage includes extra comparators, according to one embodiment.

FIG. 10 is a circuit diagram of the PRBS switching unit 324 included in an MDAC 204 of a calibrated stage 104 when the flash ADC 202 of the stage 104 includes three extra comparators 502C through 502E, according to one embodiment. The PRBS switching unit 324 still includes a range Y switch 702, range Z switch 704, and range X switch 706 as in FIG. 7. The second terminal of switches 702-706 is coupled to switch 312C of FIG. 3A, which is connected to the dither capacitor $C_D$ 308. A first terminal of the range Y switch 702 is connected to a second terminal of switch 1002A, whose first terminal is connected to a positive reference voltage ($+V_{REF}$). The first terminal of the range Y switch 702 is also connected to a second terminal of switch 1002B, whose first terminal is connected to a negative reference voltage ($-V_{REF}$).

A first terminal of the range Z switch 704 is connected to a second terminal of switch 1004A having a first terminal connected to a second terminal of switches 1006A and 1006B. The first terminal of switch 1006A is connected to the positive reference voltage ($+V_{REF}$) and the first terminal of switch 1006B is connected to ground (GND). The first terminal of the range Z switch 704 is also connected to a second terminal of switch 1004B having a first terminal connected to a second terminal of switches 1006C and 1006D. The first terminal of switch 1006C is connected to the negative reference voltage ($-V_{REF}$) and the first terminal of switch 1006D is connected to ground.

A first terminal of the range X switch 706 is connected to a second terminal of switch 1008A, whose first terminal is connected to the positive reference voltage ($+V_{REF}$). The first terminal of the range X switch 706 is also connected to a second terminal of switch 1008B, whose first terminal is connected to the negative reference voltage ($-V_{REF}$).

In one embodiment, when the MDAC 204 is in the amplification phase of the operational mode and the bits 106 output by the flash ADC 202 indicate that the stage received voltage $V_{REC}$ is within range Y, the range Y switch 702 is closed and either switch 1002A or 1002B is closed. If the bit output by the extra Y range comparator 502E is low (the stage received voltage $V_{REC}$ is less than $-V_{REF}/2$), switch 1002A is closed, which results in the dither capacitor $C_D$ 308 being connected to the positive reference voltage ($+V_{REF}$). However, if the bit output by the extra Y range comparator is 502E is high (stage received voltage $V_{REC}$ is greater than $-V_{REF}/2$), switch 1002B is closed and the dither capacitor $C_D$ 308 is connected to the negative reference voltage ($-V_{REF}$).

Figure 11:
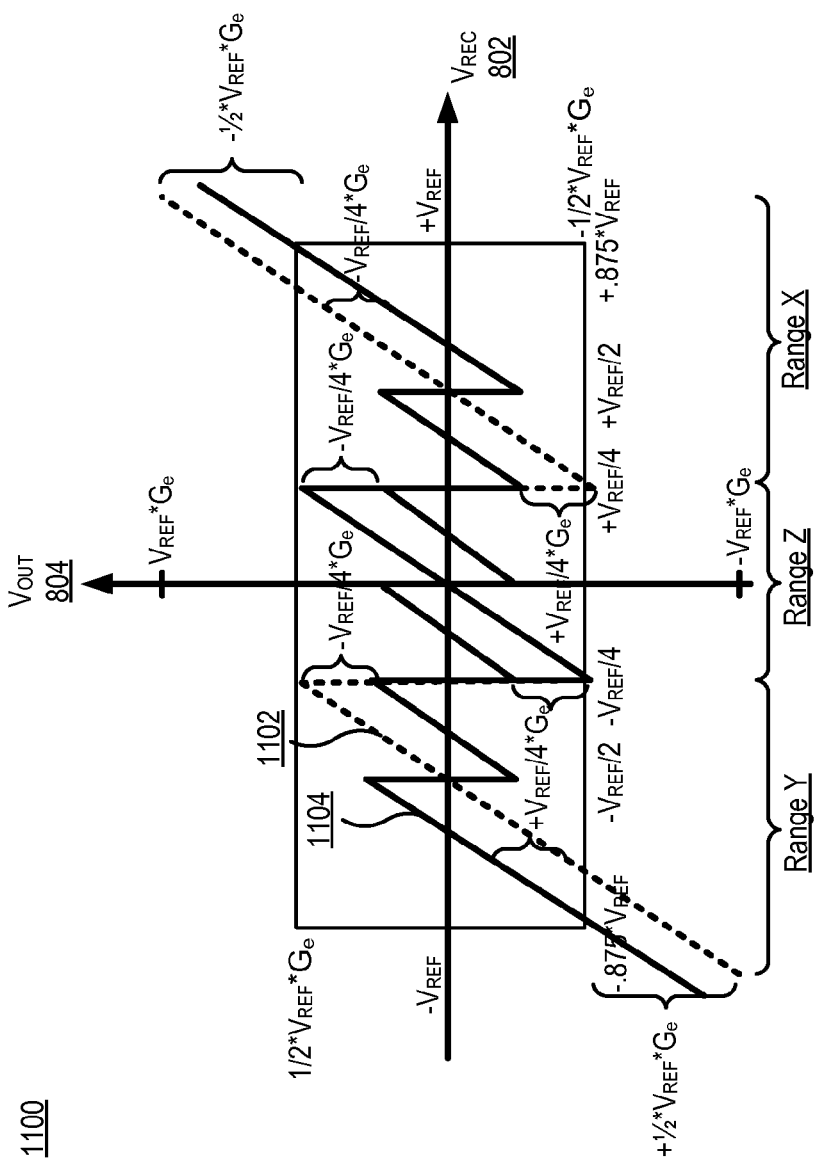
FIG. 11 is a graph comparing transfer functions of two different types of MDACs that may be included in a 1.5 bit stage, according to one embodiment.

The effects of connecting the dither capacitor $C_D$ 308 to the positive or negative reference voltage in the Y range is illustrated in FIG. 11. FIG. 11 is a graph 1100 comparing the transfer function 1102 of a standard MDAC included in a 1.5 bit stage and the transfer function 1104 of an MDAC 204 as illustrated in FIG. 3A included in a 1.5 bit stage, where the circuit of FIG. 10 is used for the PRBS switching unit 324 and the stage includes a flash ADC as illustrated in FIG. 9.

In the Y range, the extra Y range comparator 502E outputs a low bit when the stage received voltage $V_{REC}$ is between $-V_{REF}$ and $-V_{REF}/2$. In that case, as shown in the graph 1100, the PRBS switching unit 324 uses switches 702 and 1002A to connect the dither capacitor $C_D$ 308 to the positive reference voltage ($+V_{REF}$), which causes the transfer function 1104 to be shifted up by $+V_{REF}/4*G_e$. This means that when the stage received voltage $V_{REC}$ is between $-V_{REF}$ and $-V_{REF}/2$, the range of the output amplified residue voltage 108 is between $-\frac{3}{4}*V_{REF}*G_E$ and $+\frac{1}{4}*V_{REF}*G_E$.

In one embodiment, to further limit the output amplified residue voltage 108 of the MDAC 204, received voltage $V_{REC}$ is restricted. In one embodiment, the received voltage $V_{REC}$ is restricted between negative 0.875 of the reference voltage ($-0.875*V_{REF}$) and positive 0.875 of the reference voltage ($+0.875*V_{REF}$). Embodiments for restricting the received voltage $V_{REC}$ are described below with reference to FIGS. 12A and 12B. Therefore, as can been seen in the graph 1110, if the stage received voltage $V_{REC}$ is restricted, for the stage received voltage $V_{REC}$ range between $-0.875*V_{REF}$ to $-V_{REF}/2$, the output amplified voltage range 108 is between $-\frac{1}{2}*V_{REF}*G_e$ to $\frac{1}{4}*V_{REF}*G_e$ instead of $-\frac{3}{4}*V_{REF}*G_e$ to $\frac{1}{4}*V_{REF}*G_e$.

In the Y range, the extra Y range comparator 502E outputs a high bit when the stage received voltage $V_{REC}$ is between $-V_{REF}/2$ and $-V_{REF}/4$. Graph 1100 shows that by the PRBS switching unit 324 using switches 702 and 1002B to connect the dither capacitor $C_D$ 308 to the negative reference voltage ($-V_{REF}$) when the stage received voltage $V_{REC}$ is between $-V_{REF}/2$ and $-V_{REF}/4$, it causes the transfer function 1104 to be shifted down by $-\frac{1}{4}*V_{REF}*G_e$ and the output amplified residue voltage 108 to between $-\frac{1}{4}*V_{REF}*G_e$ and $+\frac{1}{4}*V_{REF}*G_e$ for this range.

Returning to FIG. 10, when the MDAC 204 is in the amplification phase and the bits 106 output by the flash ADC 202 indicate that the stage received voltage $V_{REC}$ is within range Z, the range Z switch 704 is closed and either switch 1004A or 1004B is closed. If the bit output by the extra Z range comparator 502D is low (stage received voltage $V_{REC}$ is less than 0), switch 1004A is closed, which results in the PRBS switching unit 324 injecting a PRBS by closing either switch 1006A or 1006B. On the other hand, if the bit output by the extra Z range comparator 502D is high (stage received voltage $V_{REC}$ is greater than 0), switch 1004B is closed, which results in the PRBS switching unit 324 injecting a (0, −1) bit value PRBS by closing either switch 1006C or 1006D.

In the Z range, the extra Z range comparator 502D outputs a low bit when the stage received voltage $V_{REC}$ is between $-V_{REF}/4$ and zero and outputs a high bit when the received voltage is between zero and $+V_{REF}/4$. As can be seen in the graph 1100 of FIG. 11, when the stage received voltage $V_{REC}$ is between $-V_{REF}/4$ and zero and the PRBS switching unit 324 injects the (1,0) bit value PRBS, it either does nothing to the transfer function 1104 or shifts it up by $+\frac{1}{4}*V_{REF}*G_e$. When the received voltage is between zero and $+V_{REF}/4$ and PRBS switching unit 324 injects the (0, −1) bit value PRBS, it either does nothing to the transfer function 1104 or shifts it down by $-\frac{1}{4}*V_{REF}*G_e$. Therefore, for range Z, the output amplified voltage range 108 is between $-\frac{1}{2}*V_{REF}*G_e$ and $\frac{1}{2}*V_{REF}*G_e$.

Returning to FIG. 10, when the MDAC 204 is in the amplification phase and the bits 106 output by the flash ADC 202 indicate that the received voltage is within range X, the range X switch 706 is closed and either switch 1008A or 1008B is closed. If the bit output by the extra X range comparator 502C is low (stage received voltage $V_{REC}$ is less than $+V_{REF}/2$), switch 1008A is closed, which results in the dither capacitor $C_D$ 308 being connected to the positive reference voltage $(+V_{REF})$. Alternatively, if the bit output by the extra X range comparator 502C is high (stage received voltage $V_{REC}$ is greater than $+V_{REF}/2$), switch 1008B is closed and the dither capacitor $C_D$ 308 is connected to the negative reference voltage $(-V_{REF})$.

In the X range, the extra X range comparator 502C outputs a low bit when the stage received voltage $V_{REC}$ is between $+V_{REF}/4$ and $+V_{REF}/2$ and outputs a high bit when the stage received voltage $V_{REC}$ is between $+V_{REF}/2$ and $+V_{REF}/4$. As can be seen in the graph 1100 of FIG. 11, when the stage received voltage $V_{REC}$ is between $+V_{REF}/4$ and $+V_{REF}/2$, connecting the dither capacitor $C_D$ 308 to the positive reference voltage shifts the transfer function up by $+\frac{1}{4}*V_{REF}*G_E$. When the stage received voltage $V_{REC}$ is between $+V_{REF}/2$ and $+V_{REF}$, connecting the dither capacitor $C_D$ 308 to the negative reference voltage shifts the transfer function down by $-\frac{1}{4}*V_{REF}*G_E$. Therefore, for range X, the output amplified voltage range 108 is between $-\frac{1}{4}*V_{REF}*G_e$ and $+\frac{3}{4}*V_{REF}*G_e$. However, the range can be further reduced, by restricting the maximum of the stage received voltage $V_{REC}$ to be $0.875*V_{REF}$ as described with reference to the Y range. By restricting the maximum of the stage received voltage $V_{REC}$, the range of the amplified voltage output 108 is $-\frac{1}{4}*V_{REF}*G_e$ to $+\frac{1}{2}*V_{REF}*G_e$ for range X.

Accordingly, as shown in the graph 1100, by using the additional comparators 508, the PRBS switching unit 324 of FIG. 10, and by restricting the stage received voltage $V_{REC}$ (between $\pm 0.875*V_{REF}$), the amplified residue voltage 108 output by the MDAC ranges between $-\frac{1}{2}*V_{REF}*G_e$ and $+\frac{1}{2}*V_{REF}*G_e$. The output amplified residue voltage swing of FIG. 11 is even less than that of FIG. 8. The greater reduction helps further ease the settling requirements of the MDAC 204 and decreases the non-linearity of the amplifier 302 included in the MDAC 204.

Further, when the non-linearity of the amplifier 302 for output residue voltages 108 of $\pm V_{REF}*G_e$ is not a limitation, the use of additional comparators 508 allows for the reference voltage to be increased, for example, to $2*V_{REF}$ while maintaining the output swing of the stages 104 within the range of $V_{REF}*G_e$ to $+V_{REF}*G_e$. The increase in the reference voltage also increases the range of stage received voltage $V_{REC}$, which allows the use of smaller capacitors in the stages 104 to achieve the same signal-to-noise ratio. In this way, the power consumption of the MDAC 204 can be decreased.

As described in FIG. 2, in operational mode, the calibration and error correction circuit 112 multiplies the bits of the backend ADC (lower resolution stages 104 and the flash ADC 110) seen by a calibrated stage 104 by the stage's 104 calibration coefficient $1/G_e$ to account for the gain error $G_e$ of the calibrated stage 104. In one embodiment, before the calibration and error correction circuit 112 multiplies the bits of the backend ADC by the calibration coefficient, the calibration and error correction circuit 112 determines whether a PRBS was injected in the MDAC 204 through the dither capacitor 308 when generating the residue voltage 108 passed to the backend ADC and used by the backend ADC to generate the bits. To determine whether PRBS was injected, the calibration and error correction circuit 112 analyze the bits 106 output by the stage 104/flash ADC 202. If the bits 106 indicate that the voltage $V_{REC}$ received by the stage 104 and digitized is within range Z, the calibration and error correction circuit 112 determines that a PRBS was injected by the PRBS switching unit 324 and removes it as part of background calibration.

The calibration and error correction 112 circuit removes the PRBS by subtraction in the digital domain. In one embodiment, to remove the PRBS, the calibration and error correction circuit 112 subtracts the following from the bits of the backend ADC seen by the calibrated stage 104:

$$G_e \times PRBS \times \left(\frac{2^b}{2}\right) \times \left(\frac{C_D}{C_S}\right) \qquad (12)$$

The gain error ($G_e$) is the inverse of the calibration coefficient $1/G_e$ previously calculated for the calibrated stage 104 (e.g., during foreground calibration or a previous cycle of background calibration) and being used by the correction circuit 112 for calibration of the stage 104. PRBS takes the value +1, or −1 depending on the PRBS injected and in $2^b/2$, b is the resolution of the backend ADC seen by the calibrated stage 104. $C_D/C_S$ is the mismatch of the dither capacitor $C_D$ 308 and the sampling capacitor $C_S$ 306 calculated during foreground calibration for the calibrated stage 104.

The calibration and error correction circuit 112 calculates the correlation between the digital output 114 and the PRBS to determine whether there are any PRBS remnants after the subtraction. If the calculated correlation is equal to zero, it signifies that the calibration coefficient $1/G_e$ being used by the correction circuit 112 for calibration of the stage 104 is the correct value. Since the calibration coefficient $1/G_e$ is correct, the calibration and error correction circuit 112 makes no adjustments to the calibration coefficient $1/G_e$.

However, if the calculated correlation is less than or greater than zero, it signifies that the calibration coefficient $1/G_e$ is inaccurate and needs to be adjusted. The calibration and error correction circuit 212 adjusts the calibration coefficient $1/G_e$ to minimize the correlation result. Therefore, the background calibration allows the adjustment of the calibration coefficient $1/G_e$ values in the operational mode, where the adjustments may be necessary due to temperature and supply voltage changes, as an example.

As described above in detail with reference to FIGS. 10 and 11, the received voltage $V_{REC}$ of a stage 104 may be restricted between $-0.875*V_{REF}$ and $+0.875*V_{REF}$ so that the range of the stage's amplified residue voltage 108 stays between $-\frac{1}{2} * V_{REF} * G_e$ and $+\frac{1}{2} * V_{REF} * G_e$. In one embodiment, only the stage received voltage $V_{REC}$ of the first stage 104A is restricted. The reason for restricting the stage received voltage $V_{REC}$ of the first stage 104 is that if the output residue voltage 108 of the first stage is between $-\frac{1}{2} * V_{REF} * G_e$ and $+\frac{1}{2} * V_{REF} * G_e$, the output residue voltage 108 of the subsequent stages 104B through 104X will also be between $-\frac{1}{2} * V_{REF} * G_e$ and $+\frac{1}{2} * V_{REF} * G_e$.

In one embodiment, to restrict the received voltage $V_{REC}$ of the first stage 104 (input voltage 102), the calibration and error correction circuit 112 multiplies the corrected bits 114 digitized by the calibrated stages 104A through 104N and the uncalibrated backend ADC 116 by one over the factor of the restriction prior to being output. Therefore, where the restriction of the input voltage 102 is between $-0.875 * V_{REF}$ and $+0.875 * V_{REF}$, the calibration and error correction circuit 112 multiplies the bits 114 by 1/0.875. By multiplying the bits 114 by 1/0.875, the pipeline ADC 100 will output the minimum codes when the input voltage 102 is $-0.875 * V_{REF}$ and the maximum codes when the input voltage 102 is $+0.875 * V_{REF}$. In other words, the output 114 of the pipeline ADC 100 is saturated for input voltages 102 above $+0.875 * V_{REF}$ and below $-0.875 * V_{REF}$.

Figure 12A:
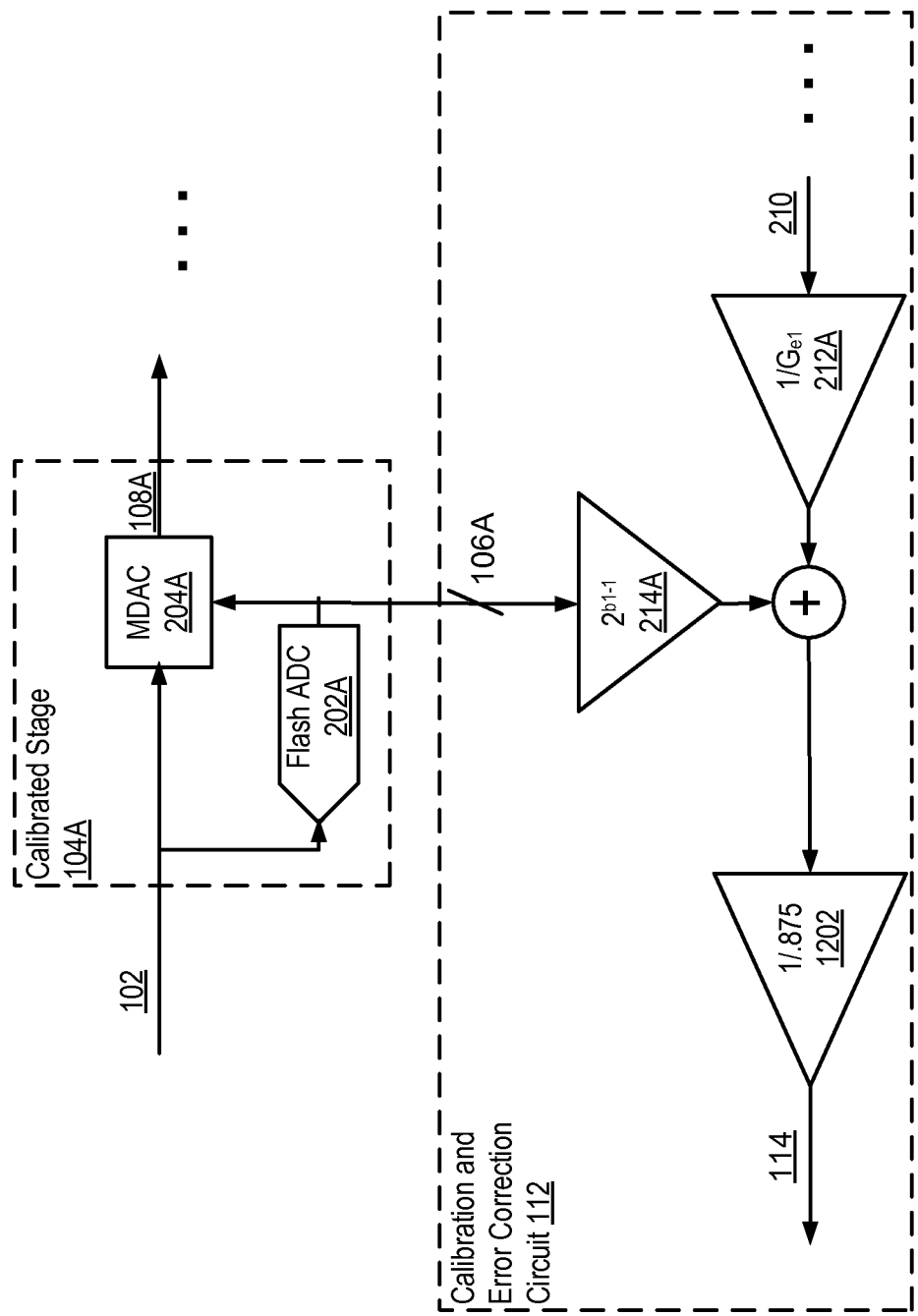
FIGS. 12A and 12B are block diagrams illustrating the restriction of an input voltage of a stage, according to one embodiment.
Figure 12B:
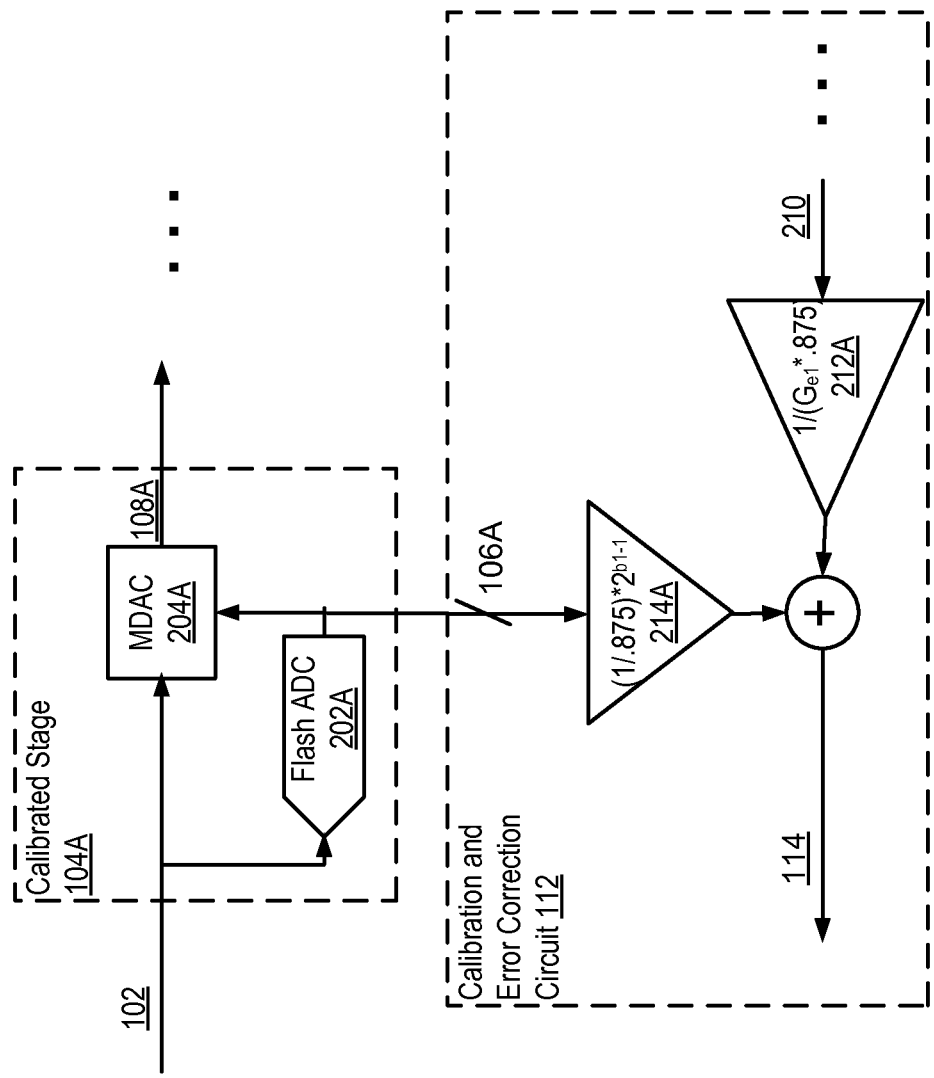

FIG. 12A illustrates the calibration and error correction circuit 112 multiplying the corrected bits 114 by 1/0.875 prior to being output. The multiplication is illustrated by element 1202 in FIG. 12A. In another embodiment, the calibration and error correction circuit 112 restricts the input voltage 102 when accounting for the gain error $G_{e1}$ of the first stage 102A. As seen in FIG. 12B, the calibration and error correction circuit 112 multiplies the bits 1202 of the backend ADC seen by the first stage 104A (calibrated stages 104B through 104N and the uncalibrated backend ADC 116) by the calibration coefficient $1/G_{e1}$ of the stage 104A and 1/0.875 (1/($G_e * 0.875$)) as illustrated by element 212A. The calibration and error correction circuit 112 additionally multiplies the bits 106A output by the first stage 104 by (1/0.875) and $2^{(b_1-1)}$, where $b_1$ is the resolution of the backend ADC seen by the first stage 104A. The multiplication is illustrated by element 214A in FIG. 12B. The summation of the multiplied bits (210 and 106A) are the bits 114 output by the pipeline ADC 100. Therefore, in this embodiment, the restriction is incorporated into the gain error $G_{e1}$.

Process Flow

Figure 13:
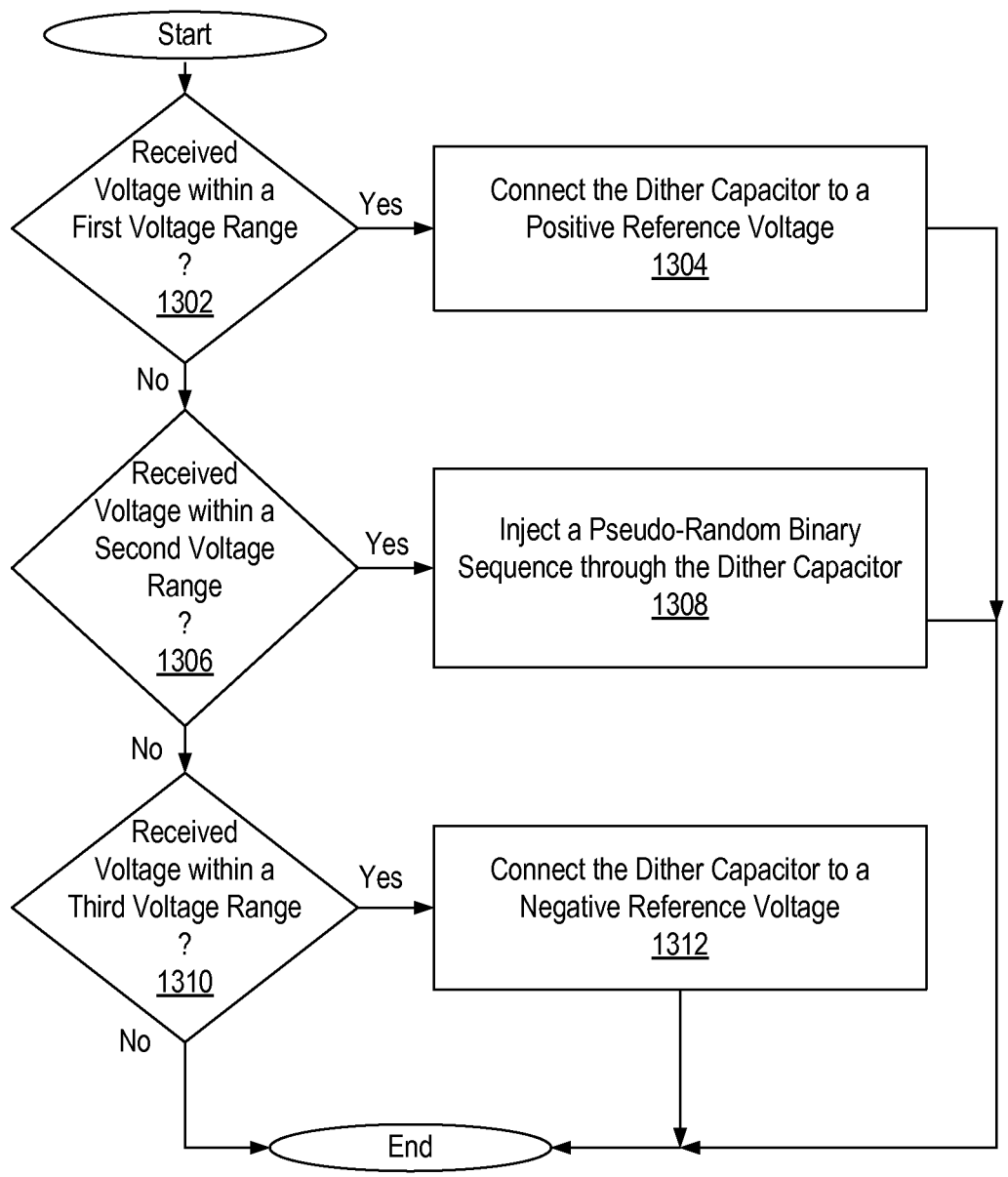
FIG. 13 is a flow chart illustrating a PRBS switching unit applying a connection scheme to a dither capacitor of an MDAC included in a calibrated stage, according to one embodiment.

FIG. 13 is a flow chart 1300 illustrating the PRBS switching unit 324 applying a connection scheme to the dither capacitor $C_D$ 308 of an MDAC 204 included in a calibrated stage 104A through 104N, according to one embodiment. Other embodiments can perform the steps of FIG. 5 in different orders. Moreover, other embodiments can include different and/or additional steps than the ones described here.

Assume for purposes of this example that the calibrated stage 104 has received a voltage $V_{REC}$, the flash ADC 202 included in the stage 104 has digitized the stage received voltage $V_{REC}$ and the MDAC is in the amplification phase of the operational mode. The PRBS switching unit 324 determines 1302 if the stage received voltage $V_{REC}$ is within a first voltage range. In one embodiment, the PRBS switching unit 324 makes the determination based on the bits 106 output by the flash ADC 202. In one embodiment, the first voltage range is from $-V_{REF}$ to $-V_{REF}/4$ (i.e., range Y). If the stage received voltage $V_{REC}$ is within the first voltage range, the PRBS switching unit 324, connects 1304 a second terminal of the dither capacitor $C_D$ 308 to a positive reference voltage $(+V_{REF})$ regardless of a PRBS in order to increase the residue voltage 108 output by the stage 104.

If the stage received voltage $V_{REC}$ is not within the first voltage range, the PRBS switching unit 324 determines 1306 if the stage received voltage $V_{REC}$ is within a second voltage range. In one embodiment, the second voltage range is from $-V_{REF}/4$ to $+V_{REF}/4$ (i.e., range Z). If the stage received voltage $V_{REC}$ is within the second voltage range, the PRBS switching unit 324 injects 1308 a PRBS through a second terminal of the dither capacitor $C_D$ 308. The PRBS is injected so that the calibration and error correction circuit 112 can perform background calibration and determine whether to update the calibration coefficient $1/G_e$ of the stage 104.

If the stage received voltage $V_{REC}$ is not within the first or second voltage range, the PRBS switching unit 324 determines 1310 if the stage received voltage $V_p$ is within a third voltage range. In one embodiment, the third voltage range is from $+V_{REF}/4$ to $+V_{REF}$ (i.e., range X). If the stage received voltage $V_{REC}$ is within the third voltage range, regardless of the PRBS, the PRBS switching unit 324 connects 1312 the second terminal of the dither capacitor $C_D$ 308 to a negative reference voltage $(-V_{REF})$ in order to decrease the residue voltage 108 output by the stage 104. Therefore, the connection scheme applied by the PRBS switching unit 324 reduces the output voltage swing of the stage, while still allowing background calibration.

Additional Configuration Considerations

Although the subject matter was described in the context of a pipeline ADC, the principles described may be applied to any electronic device that contains a MDAC. For example, the subject matter described may also be applied to other types of ADCs that include a MDAC.

Upon reading this disclosure, those of skill in the art will appreciate still additional alternative structural and functional designs for a system and a process for determining the calibration coefficients of pipeline ADC stages through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A pipeline analog-to-digital converter comprising:
   a plurality of calibrated stages, each of the plurality of calibrated stages comprising:
       an amplifier generating an output representing an amplified difference between a first voltage at an input of the amplifier and a second voltage at another input of the amplifier, and
       a dither capacitor having a first terminal coupled to the input of the amplifier and a second terminal coupled to:
           a first reference voltage responsive to a voltage received by the calibrated stage being within a first range,
           a second reference voltage lower than the first reference voltage responsive to the received voltage being within a second range, and
           the first reference voltage or the second reference voltage depending on a bit value of a Pseudo-Random Binary Sequence (PRBS) responsive to the received voltage being within a third range; and
   a correction circuit coupled to the plurality of calibrated stages and configured to:

adjust a calibration coefficient of a calibrated stage responsive to the second terminal of the dither capacitor included in the calibrated stage being coupled to the first reference voltage or the second reference voltage dependent on the bit value and remnants of the PRBS remaining after attempting to subtract the PRBS from bits generated by one or more stages and a flash analog-to-digital converter included in the pipeline analog-to-digital converter, and compensate for a gain error of the calibrated stage based on the adjusted calibration coefficient.

2. The pipeline analog-to-digital converter of claim 1, wherein responsive to the received voltage being within the first range or the second range, the second terminal of the dither capacitor is coupled to the first reference voltage or the second reference voltage independent of the PRBS.

3. A pipeline analog-to-digital converter comprising:
a plurality of calibrated stages, each of the plurality of calibrated stages comprising:
an amplifier generating an output representing an amplified difference between a first voltage at an input of the amplifier and a second voltage at another input of the amplifier, and
a dither capacitor having a first terminal coupled to the input of the amplifier and a second terminal selectively coupled to:
either a first reference voltage or a second reference voltage lower than the first reference voltage depending on a bit value in a sequence of binary values responsive to a voltage received by the calibrated stage being within a first range, and
the first reference voltage independent of the sequence of binary values responsive to the received voltage being within a second range; and
a correction circuit coupled to the plurality of calibrated stages and configured to adjust a calibration coefficient that accounts for a gain error of a calibrated stage.

4. The pipeline analog-to-digital converter of claim 3, wherein the second terminal of the dither capacitor is coupled to:
the second reference voltage responsive to the received voltage being within a third range different from the first range and the second range, the first range is higher than the second range and the third range is higher than the second range.

5. The pipeline analog-to-digital converter of claim 4, wherein responsive to the received voltage being within the third range, the second terminal is coupled to the second reference voltage independent of the sequence of binary values.

6. The pipeline analog-to-digital converter of claim 3, wherein the first range is from one fourth of a negative reference voltage to one fourth of a positive reference voltage.

7. The pipeline analog-to-digital converter of claim 3, wherein the second range is from a negative reference voltage to one fourth of the negative reference voltage.

8. The pipeline analog-to-digital converter of claim 4, wherein the third range is from one fourth of a positive reference voltage to the positive reference voltage.

9. The pipeline analog-to-digital converter of claim 3, wherein the second terminal of the dither capacitor is coupled to:
the first reference voltage responsive to the received voltage being within the second range and a third range; and
the second reference voltage responsive to the received voltage being within the second range and a fourth range.

10. The pipeline analog-to-digital converter of claim 9, wherein the second range is between a negative reference voltage and one fourth of the negative reference voltage, the third range is between the negative reference voltage and one half of the negative reference voltage, and the fourth range is between one half of the negative reference voltage and a positive reference voltage.

11. The pipeline analog-to-digital converter of claim 9, wherein the second range is between one fourth of a positive reference voltage and the positive reference voltage, the third range is between a negative reference voltage and one half of the positive reference voltage, and the fourth range is between one half of the positive reference voltage and the positive reference voltage.

12. The pipeline analog-to-digital converter of claim 3, wherein the sequence of binary values is a Pseudo-Random Binary Sequence (PRBS) and the second terminal of the dither capacitor is coupled to:
either the first reference voltage or the second reference voltage dependent on a bit value of the PRBS responsive to the received voltage being within the first range and a third range; and
either the second reference voltage or a third reference voltage dependent on the bit value of the PRBS responsive to the received voltage being within the first range and a fourth range.

13. The pipeline analog-to-digital converter of claim 12, wherein the first range is between one fourth of a negative reference voltage and one fourth of a positive reference voltage, the third range is between the negative reference voltage and zero, and the fourth range is between zero and the positive reference voltage.

14. The pipeline analog-to-digital converter of claim 3, wherein the voltage received by the calibrated stage is restricted to be between a first voltage value and a second voltage value.

15. The pipeline analog-to-digital converter of claim 14, wherein restricting the received voltage comprises multiplying bits output by the plurality of calibrated stages based on a factor of the restriction.

16. The pipeline analog-to-digital converter of claim 3, wherein the correction circuit is configured to adjust the calibration coefficient of the calibrated stage responsive to (i) coupling the second terminal of the dither capacitor of the calibrated stage to the first reference voltage or the second reference voltage based on the bit value of the sequence of binary values and (ii) remnants of the sequence remaining after subtracting the sequence from bits generated by one or more stages and a flash analog-to-digital converter included in the pipeline analog-to-digital converter.

17. A method comprising:
receiving a voltage by a calibrated stage of a pipeline analog-to-digital converter, the calibrated stage including an amplifier and a dither capacitor, the amplifier generating an output representing an amplified difference between a first voltage at an input of the amplifier and a second voltage at another input of the amplifier, the dither capacitor having a first terminal coupled to the input of the amplifier; and
selectively coupling a second terminal of the dither capacitor to:
either a first reference voltage or a second reference voltage lower than the first reference voltage depending on a bit value in a sequence of binary values responsive to a voltage received by the calibrated stage being within a first range, the first reference voltage independent of the sequence of binary values responsive to the received voltage being within a second range, and the second reference voltage responsive to the received voltage being within a third range different from the first range and the second range, the first range is higher than the second range and the third range is higher than the second range.

18. The method of claim 17, wherein responsive to the received voltage being within the third range, the second terminal is coupled to the second reference voltage independent of the sequence of binary values.

19. The method of claim 17, wherein the sequence of binary values is a Pseudo-Random Binary Sequence (PRBS) and the second terminal of the dither capacitor is coupled to:

either the first reference voltage or the second reference voltage dependent on a bit value of the PRBS responsive to the received voltage being within the first range and a fifth range; and either the second reference voltage or a third reference voltage dependent on the bit value of the PRBS responsive to the received voltage being within the first range and a fourth range.

* * * * *